United States Patent
Price

(10) Patent No.: US 9,263,553 B2
(45) Date of Patent: Feb. 16, 2016

(54) TRANSISTOR AND ITS METHOD OF MANUFACTURE

(75) Inventor: Richard David Price, Manchester (GB)

(73) Assignee: Pragmatic Printing Limited, Co Durham (GB)

( * ) Notice: Subject to any disclaimer, the term of this patent is extended or adjusted under 35 U.S.C. 154(b) by 409 days.

(21) Appl. No.: 13/638,061

(22) PCT Filed: Mar. 29, 2011

(86) PCT No.: PCT/GB2011/050644
§ 371 (c)(1),
(2), (4) Date: Sep. 28, 2012

(87) PCT Pub. No.: WO2011/121347
PCT Pub. Date: Oct. 6, 2011

(65) Prior Publication Data
US 2013/0020643 A1 Jan. 24, 2013

(30) Foreign Application Priority Data
Mar. 30, 2010 (GB) .................................. 1005356.9

(51) Int. Cl.
*H01L 21/336* (2006.01)
*H01L 29/66* (2006.01)
*H01L 51/05* (2006.01)
(Continued)

(52) U.S. Cl.
CPC ...... *H01L 29/66757* (2013.01); *H01L 27/1214* (2013.01); *G03F 7/0002* (2013.01); *H01L 27/1259* (2013.01); *H01L 27/1292* (2013.01); *H01L 51/0541* (2013.01)

(58) Field of Classification Search
CPC .............................................. H01L 29/66757
See application file for complete search history.

(56) References Cited

U.S. PATENT DOCUMENTS

| 5,554,488 A | 9/1996 | Rioux |
| 2005/0266693 A1 | 12/2005 | Maekawa |

(Continued)

FOREIGN PATENT DOCUMENTS

| GB | 2 425 401 A | 10/2006 |
| WO | WO 2009/018395 A2 | 2/2009 |
| WO | WO 2009/072532 A1 | 6/2009 |

OTHER PUBLICATIONS

PCT International Search Report for International Application No. PCT/GB2011/050644, dated Jul. 7, 2011 (7 pages).

(Continued)

*Primary Examiner* — Matthew W Such
*Assistant Examiner* — Abul Kalam
(74) *Attorney, Agent, or Firm* — Myers Bigel Sibley & Sajovec, PA

(57) ABSTRACT

A transistor includes a substrate, a source terminal and a drain terminal, each terminal being supported by the substrate, and the source and drain terminal being separated by a portion of the substrate, a layer of semiconductive material deposited so as to cover the portion of the substrate and to connect the source terminal to the drain terminal, a layer of dielectric material deposited so as to cover at least a portion of the layer of semiconductive material, and a layer of electrically conductive material deposited so as to cover at least a portion of the layer of dielectric material. The layer of electrically conductive material providing a gate terminal to which a potential may be applied to control a conductivity of the layer of semiconductive material connecting the source and drain terminals.

16 Claims, 24 Drawing Sheets

(51) Int. Cl.
*H01L 27/12* (2006.01)
*G03F 7/00* (2006.01)

(56) References Cited

U.S. PATENT DOCUMENTS

| | | |
|---|---|---|
| 2007/0278577 A1 | 12/2007 | Sakakura |
| 2008/0017865 A1 | 1/2008 | Itoh et al. |
| 2008/0142803 A1 | 6/2008 | Kaitoh et al. |
| 2009/0159880 A1 | 6/2009 | Honda et al. |
| 2009/0269920 A1 | 10/2009 | Park et al. |
| 2010/0193912 A1* | 8/2010 | Speakman .................... 257/618 |

OTHER PUBLICATIONS

Austin et al. "Fabrication of 70 nm Channel Length Polymer Organic Thin-Film Transistors Using Nanoimprint Lithography" *Applied Physics Letters* 91(23):4431-4433 (Dec. 2, 2002).

International Preliminary Report on Patentability Corresponding to International Application No. PCT/GB2011/050644; Date of Mailing: Oct. 11, 2012; 17 Pages.

Pannemann, Ch. et al., "Nanometer scale organic thin film transistors with Pentacene", *Microelectronic Engineering*, 67-68 (2003), pp. 845-852.

* cited by examiner

TRANSISTOR AND ITS METHOD OF MANUFACTURE

CROSS-REFERENCE TO RELATED APPLICATION

This application is a 35 U.S.C. §371 national stage application of PCT International Application No. PCT/GB2011/050644, filed on Mar. 29, 2011, which claims priority to GB 1005356.9, filed on Mar. 30, 2010, the entire contents of which are incorporated by reference herein as if set forth in their entirety.

FIELD

The present invention relates to transistors, and in particular, although not exclusively, to thin film transistors.

BACKGROUND TO THE INVENTION

A wide variety of transistors are known. These include field effects transistors, in which the conductivity of a channel or layer of semiconductive material arranged between a source terminal and a drain terminal is controlled by application of a potential to a gate terminal. Thin-film transistors are also known. Thin film transistors (TFTs) are a type of field effect transistor (FET) typically made by depositing a thin film of a semiconductive active layer as well as a dielectric layer and metallic contacts over a supporting substrate. In certain applications, the substrate is glass, for example where the TFT is used in a liquid crystal display. TFTs can be made using a wide variety of semiconductive materials. By using transparent semiconductors and transparent electrodes, such as indium tin oxide (ITO), certain TFT devices can be made completely transparent.

In the manufacture of known TFTs, it is necessary to achieve alignment between the gate and source and drain terminals. In the past, lithographic techniques have been used to manufacture TFTs, with, typically, one mask defining the relative positions of source and drain terminals and another mask defining the positions of the gate terminals, for example where an array of a large number of TFTs is being produced. Clearly, a problem with such techniques is achieving the appropriate alignment between the finely patterned masks used at different stages of the manufacturing process. Another problem arises where the substrate has a large area and the array of TFT devices is to be distributed over that large area. Imperfections and distortions in the substrate can result in local misalignments between the source and drain and the gate of one or more TFT devices. In the manufacture of liquid crystal displays, for example, these misalignments can result in faulty pixels, which degrade the display and indeed may render it unacceptable.

Additional problems associated with the manufacture of thin-film transistors include the following. The minimum size of the device features is limited by the manufacturing techniques, which in turn limits the density of devices which can be formed on a single substrate, for example limiting the resolution of a display incorporating an array of TFTs. The correct operation of the thin film transistors is typically highly sensitive to the quality of the interfaces between the different device layers, such as the interface between the substrate and semiconductor material, the interface between the semiconductor material and the gate dielectric, and the interface between the gate dielectric and the gate electrode itself. These interfaces are degraded, and the performance of the TFT itself is degraded, when there are imperfections in these interfaces, such as when these interfaces become contaminated during the manufacturing process. It is therefore desirable to develop a method of manufacturing thin-film transistors which assists in the formation of clean, defect free interfaces.

SUMMARY OF THE INVENTION

Embodiments of the present invention aim to solve, at least partly, one or more of the problems associated with the prior art.

Particular embodiments aim to provide a method of manufacturing a transistor which facilitates correct alignment between the source, drain, and gate terminals.

Certain embodiments of the invention aim to provide methods of manufacturing transistors which are particularly suited to the manufacture of large-area devices, such as liquid crystal displays incorporating a large number of TFTs.

Certain embodiments aim to provide techniques of manufacturing transistors which are compatible with fast and high volume manufacturing of large-area devices.

Certain embodiments aim to provide transistors, and methods of manufacturing such transistors, having nanoscale features, i.e. features with dimensions in the range $10^{-9}$ to $10^{-7}$ m or even smaller.

According to a first aspect of the present invention there is provided a method of manufacturing a transistor, the method comprising:

providing a substrate and a region of electrically conductive material supported by the substrate;
  forming at least one layer of resist material over said region to form a covering of resist material over said region;
  forming a depression in a surface of the covering of resist material, said depression extending over a first portion of said region, said first portion separating a second portion of the region from a third portion of the region;
  removing resist material located under said depression so as to form a window, through said covering, exposing said first portion of the electrically conductive region;
  removing said first portion to expose a portion of substrate separating the second portion from the third portion of the region;
  depositing semiconductive material at least inside the window to form a layer of semiconductive material connecting the second portion to the third portion;
  depositing dielectric material to form a layer of dielectric material over said layer of semiconductive material;
  depositing electrically conductive material to form a layer of electrically conductive material over said layer of dielectric material; and
  removing resist material at least from around said window so as to expose the second and third portions,
  whereby said second and third portions provide a source terminal and a drain terminal respectively and the layer of electrically conductive material provides a gate terminal to which a potential may be applied to control a conductivity of the layer of semiconductive material connecting the second and third portions.

This method provides the substantial advantage that correct alignment of the source, drain, and gate terminals (and indeed the correct positioning of the semiconductor layer or channel and gate dielectric) is achieved by the single step of forming the depression. In other words, the position of the depression formed in the covering of resist material defines, in a single step, the position of the source terminal, the position of the drain terminal, the position of the semiconductive layer connecting them, and the position of the gate relative to the semiconductor. In this way, alignment problems associated with the prior art are overcome.

It will be appreciated that the region of electrically conductive material (which can also be described as an area or layer of electrically conductive material) can be formed on the substrate using a wide range of known techniques. Any suitable known technique can therefore be employed in this step of the method in accordance with the first aspect of the invention.

A wide variety of materials may be used for the substrate, which in certain embodiments may be transparent, and in others opaque. In certain embodiments the substrate consists of a single layer or body of substrate material. In certain embodiments the substrate has a multi-component (e.g. multi-layer) structure, comprising a plurality of different substrate materials.

In certain embodiments the substrate comprises at least one material (e.g. in the form of a layer of that material) selected from a list comprising: glass (rigid or flexible); polymer (e.g. polyethylene naphthalate or polyethylene terephthalate); polymeric foil; paper; insulator coated metal (e.g. coated stainless-steel); cellulose; polymethyl methacrylate; polycarbonate, polyvinylalcohol; polyvinyl acetate; polyvinyl pyrrolidone; polyvinylphenol; polyvinyl chloride; polystyrene; polyethylene naphthalate; polyethylene terephthalate; polyamide (e.g. Nylon); poly(hydroxyether); polyurethane; polycarbonate; polysulfone; polyarylate; acrylonitrile butadiene styrene, 1-Methoxy-2-propyl acetate (SU-8), polyhydroxybenzyl silsesquioxane (HSQ), polyimide, Benzocyclobutene (BCB), $Al_2O_3$, $SiO_xN_y$, $SiO_2$, $Si_3N_4$; Uv-curable resin; Nanoimprint resist; photoresist.

In certain embodiments the substrate may be a multi-component system in which the first conductive layer has embedded conductive structures within one or more of the components. The multi-component system may include a release layer, releasable by methods such as UV, thermal, laser or physical peeling, which enables one or more of the components to be detached from the other components. Such detachment may be used to expose or enable easier exposure of the embedded conductive structures connected to the first conductive layer. In certain embodiments the substrate may comprise one or more embedded/incorporated features and/or devices. For example, the substrate may comprise a plurality of conductive tracks to provide connections to, and interconnections between, one or more transistors formed on the substrate.

A wide variety of techniques may also be used to form the at least one layer of resist material, and a variety of resist materials may be employed in different embodiments of the invention. These methods of forming the at least one layer of resist material include coating (spin, dip, blade, bar, spray, slot-die) or extrusion. Suitable resist materials include poly hydroxybutyrate, polymethyl methacrylate, polyvinylalcohol, polyvinyl acetate, polyvinyl pyrrolidone, polyvinylphenol, polyvinyl chloride, polystyrene, polyamide (e.g. Nylon), poly(hydroxyether), polyurethane, polycarbonate, polysulfone, polyarylate, acrylonitrile butadiene styrene, polyimide, benzocyclobutene (BCB), photoresist, 1-Methoxy-2-propyl acetate (SU-8), polyhydroxybenzyl silsesquioxane (HSQ), fluorinated polymers e.g. PTFE, uv curable liquid resin (such as those described in U.S. Pat. No. 6,284,072), silicone, silioxane, parylene. Commercial imprint resists are available through companies such as Microchem/Microresist, Shipley and Nanolithosolution Inc.

A variety of techniques may be employed for forming the depression in a surface (e.g. a nominal upper surface) of the covering of resist material. One suitable technique is to employ a mask to define the location of the depression, and then to remove material to form a depression. Another technique which is used in certain embodiments of the invention is to form the depression using an imprint tool, which may also be referred to as an imprint stamp or shim. This imprint tool typically will have an imprint feature protruding from a base surface, the imprint tool being positioned with respect to the covering of resist material so that the imprint feature is correctly located over the first portion. The depression may be formed by pressing the imprint tool against the covering after the covering has been formed. Alternatively, in other embodiments the depression may be formed by imprinting the resist material at the same time as the covering, or at least an upper layer of it, is formed.

In certain embodiments the covering comprises just a single layer of resist material. However, in alternative embodiments the covering comprises a plurality of layers. In certain embodiments, the covering comprises a first layer of a first resist material, and a second layer of a second, different resist material, formed over the first layer. In certain embodiments, the first resist material is a lift-off resist material, such as Microchem LOR or AR-ULP underlayer polymer (Nanolithosolution Inc). In certain embodiments, the second resist material is an imprintable resist material. Thus, in certain embodiments, the depression can be formed in a surface of a second layer of imprintable resist material at the same time that the second layer is formed. For example, the second resist material may be a UV curable polymer and the imprint tool or mask may be transparent to UV such that the resist material can be cured while the imprint mask is in contact with it, thereby defining the depression.

The removing of the resist material located under the depression to form a window can be achieved using a variety of techniques. These techniques include ablation (e.g., laser) and etching (chemical, dry, reactive-ion, plasma).

The depositing of semiconductive material at least inside the window can be achieved using a variety of techniques. These techniques include the following: vapour deposition (physical e.g. sputter; chemical e.g. PECVD); vacuum deposition (e.g. thermal or e-beam evaporation); coating e.g. spray, spin, slot, die; printing e.g. jet; pulsed-laser deposition (PLD); atomic-layer deposition (ALD).

It will be appreciated that, in certain embodiments of the invention, the deposition techniques result in semiconductive material being deposited additionally outside the window, that is on top of the covering of resist material in which the window is defined. It will also be appreciated that semiconductive material deposited outside the window, on top of the covering of resist material, is removed in the later step of the method when resist material, round the window, is removed.

A wide variety of semiconductive materials may be used in embodiments of the invention, including for example: metal oxides such as zinc oxide, tin oxide, cuprous oxide; inorganic semiconductor such as amorphous, microcrystalline or nanocrystalline silicon; binary metal oxides such as zinc tin oxide, indium tin oxide, indium zinc oxide; ternary metal oxides such as GaInZnO; metal oxynitrides e.g. $Zn_xO_yN_z$; organic semiconductors.

The depositing of dielectric material can be performed using a variety of techniques, including: vapour deposition (physical e.g. sputter; chemical e.g. PECVD); vacuum deposition (e.g. thermal or e-beam evaporation); coating e.g. spray, spin, slot, die; printing e.g. jet; pulsed-laser deposition (PLD); atomic-layer deposition (ALD).

Again, in certain embodiments of the invention this deposition of dielectric material will also result in dielectric material being deposited on top of semiconductive material itself overlaying resist material, outside the window. Thus, the method in certain embodiments results in a multi-layer structure being built up directly on the substrate, inside the window, and a corresponding multi-layer structure being built up on top of the covering of resist material outside the window. The multilayer structure built up on the covering of resist is typically completely removed at a later stage, leaving just the multi-layer structure that was formed in the window to form part of the eventual transistor.

Dielectric materials suitable for use in embodiments of the invention include the following: polymethyl methacrylate, polybutyl methacrylate, polyethyl methacrylate, polyvinyl acetate, polyvinyl pyrrolidone, polyvinylphenol, polyvinylchloride, polystyrene, polyethylene, polyvinyl alcohol, polycarbonate, parylene; inorganic insulator such as silica, silicon nitride, metal oxide (e.g. $Al_2O_3$, $HfO_2$, $TiO_2$, $Ta_2O_5$), metal phosphates (e.g. $Al_2PO_x$), metal sulphates/sulfites (e.g. $HfSO_x$), metal oxynitrides (e.g. $AlO_xN_y$), metal nitride (AlN), silicone, silioxane, $SiN_x$ The depositing of electrically conductive material can be achieved using a variety of techniques, including: vapour deposition (physical e.g. sputter; chemical e.g. PECVD); vacuum deposition (e.g. thermal or e-beam evaporation); coating e.g. spray, spin, slot, die; printing e.g. jet; pulsed-laser deposition (PLD); atomic-layer deposition (ALD).

A wide range of materials can be used as the electrically conductive material, including for example: metal (e.g. Au, Ag, Ti, Al, Cr, Ni, Cu, Ta, W, Pt, etc.), transparent conductive oxide (e.g. ITO, AZO, IZO), carbon black, carbon nanotubes, conducting polymer (e.g. polyaniline, PEDOT:PSS)

Again, it will be appreciated that the depositing of electrically conductive material may also result in electrically conductive material being built up on top of the semiconductor and dielectric layers formed over the covering of resist material at least around the window.

The resist in certain embodiments can be selected so as to discourage or repel growth of one or more thin-films, i.e. semiconductive, dielectric or conductive, on the resist during the deposition process. The resist in certain embodiments can additionally be chemically modified to change its surface properties, for example with a fluorinated silane or other fluorinated coating, or formulated so as to make the surface substantially hydrophobic or hydrophilic or lyophobic. An alternative chemical treatment as described in EP1124791 or U.S. Pat. No. 7,034,129, the contents of which are incorporated by reference herein, may also be applied to change the surface hydrophobicity. Additional surface treatment such as UV, plasma, ozone, corona discharge or piranha etch may also be applied. The choice will depend on the materials to be deposited and the selectivity of the deposited layer to the surface treatment.

The removing of resist material at least from around the window can be achieved using a variety of techniques, including: development with lift-off remover (e.g. Microchem nanoremover PG), solvent (e.g. organic, aqueous), ozone (e.g. ozonated water); planarization and milling (e.g. ion)/grinding (e.g. chemical, physical)/etching (e.g. dry, wet, reactive-ion); or a combination of one or more of the previous techniques.

In embodiments where the covering of resist material comprises just lift-off resist material, or a bottom layer of lift-off resist material, this removing step can also be referred to as a lift-off step.

In certain embodiments, the method may further comprise undercutting (i.e. forming at least one undercut in) the covering of resist material around the window before said depositing of semiconductive material so as to expose a part of an upper surface of the second portion adjacent the separating portion of substrate and expose a part of an upper surface of the third portion adjacent the separating portion of substrate.

This provides the advantage that the deposition of the semiconductive material inside the window can be arranged such that the semiconductive layer connecting the second and third regions (i.e. the source and drain regions) can be arranged to partially overlap or overlie those regions and so provide better electrical contact (and better charge transfer) between the terminals and the semiconductive layer than could be achieved if just edges of the semiconductive layer were in edge contact with the source and drain regions.

In certain embodiments, improved electrical connection between the source and drain and semiconductive layer can be achieved by forming steps in the exposed parts of the second and third portions before depositing the semiconductive material, and then depositing the semiconductive material in a manner such that the layer of semiconductive material covers (i.e. overlaps or overlays) at least part of each step.

In certain embodiments, the undercutting around the window is achieved by selecting first and second layers of resist material having different properties, and then preferentially removing material of the underlying layer. For example, the different resist materials may be selected so as to have different etch rates for a given etching material or process, the etching rate of the lower layer being greater than that of the upper layer or layers.

In addition to employing undercutting, the window may also generally be widened before the semiconductive material is deposited, so as to expose even greater areas of the source and drain regions. This widening may be performed at the same time as the undercutting, after the undercutting, or, in certain embodiments, as an alternative to undercutting. By exposing even greater portions of the second and third regions (i.e. the source and drain regions) the semiconductive layer can be formed in a manner so as to provide better contact to those regions.

It will be appreciated that a substantial advantage of employing undercutting in certain embodiments of the invention is that, as the semiconductive, dielectric, and conductive layers are sequentially deposited (i.e. built up) inside the window, the associated build up of semiconductive, dielectric, and conductive material on the overhanging lip or rim of the window may result in the areas of the layers becoming progressively smaller inside the window region. This helps to ensure that the gate material does not form a short to the source and/or drain regions, and furthermore ensures that the layer of dielectric material completely insulates the gate layer from the semiconductive layer. The formation of the undercut or undercuts also helps to maintain a break between the layers of materials deposited inside the window and the corresponding layers of materials deposited on top of the covering of resist material surrounding the window. In turn, this facilitates the final removal or lift-off step, whereby the "unwanted" semiconductive, dielectric, and conductive material is removed, leaving just the desired multi-layer structure arranged with respect to the source and drain terminals.

According to a second aspect of the present invention there is provided a method of manufacturing a transistor, the method comprising:

providing a substrate supporting a source terminal and a drain terminal, the source terminal being separated from the drain terminal by a portion of the substrate;

forming at least one layer of resist material over the source terminal, the drain terminal and said separating portion of the substrate to form a covering of resist material over the source terminal, the drain terminal and said separating portion of the substrate;

forming a depression in a surface of the covering of resist material, said depression extending over the separating portion of the substrate and over at least respective portions of the source and drain terminals adjacent the separating portion;

removing resist material located under said depression so as to form a window, through said covering, exposing the separating portion of substrate and said respective portions of the source and drain terminals adjacent the separating portion;

depositing semiconductive material at least inside said window to form a layer of semiconductive material connecting the source terminal to the drain terminal;

depositing dielectric material to form a layer of dielectric material over said layer of semiconductive material;

depositing electrically conductive material to form a layer of electrically conductive material over said layer of dielectric material; and removing resist material at least from around said window so as to expose at least part of the source terminal and at least part of the drain terminal, whereby said layer of electrically conductive material provides a gate terminal to which a potential may be applied to control a conductivity of the layer of semiconductive material connecting the source and drain terminals.

It will be appreciated that, in this aspect of the invention, correct alignment is required between the depression formed in the covering of resist material and the "gap" already defined and separating the source and drain. However, having achieved this correct alignment, to provide an adequate overlap between the depression and the source and drain terminals, the subsequent correct alignment of the semiconductive layer, gate dielectric, and gate electrode itself is ensured.

It will be appreciated that features of embodiments of the first aspect of the invention may equally be employed in embodiments of this second aspect of the invention.

For example, in certain embodiments said forming at least one layer comprises forming a first layer of a first resist material over the source terminal, the drain terminal and said separating portion of the substrate, and forming a second layer of a second resist material over the first layer.

In certain embodiments, the method further comprises undercutting (forming at least one undercut in) the covering of resist material around the window before said depositing of semiconductive material so as to expose additional portions of the source and drain terminals adjacent said respective portions.

In certain embodiments, said depositing of semiconductive material is arranged such that the layer of semiconductive material at least partly covers (overlays) said additional portions.

In certain embodiments, the method further comprises forming a step in an exposed portion of the source terminal and a step in an exposed portion of the drain terminal before depositing said semiconductive material. In such embodiments, the depositing of semiconductive material may be arranged such that the layer of semiconductive material covers at least part of each step.

In certain embodiments, the undercutting comprises forming at least one undercut in the first layer.

Certain embodiments of the first aspect of the invention and certain embodiments of the second aspect of the invention comprise an additional step of using said gate terminal as a mask and removing dielectric material and semiconductive material not directly under said mask. In other words, suitable techniques, such as milling (e.g. ion) or etching (e.g. dry, wet, reactive-ion), can be used to "trim" dielectric and semiconductive material protruding from one or more edges of the gate. An advantage of using the gates as a mask in this way, to trim away semiconductive and dielectric material, is that parasitic capacitances can be eliminated or at least reduced. These undesirable gate to source/drain capacitances have a negative impact on circuit performance, and their impact is actually increased by a phenomenon known as the Miller Effect, which causes an increase in the effective input capacitance of amplifier circuits.

In certain embodiments the method further comprises widening the window after the depositing of semiconductive material but before the depositing of dielectric material. This provides an advantage that surface portions of source and drain adjacent the semiconductive layer can be exposed and then covered by dielectric material, such that the dielectric completely covers and encapsulates the semiconductive layer, so passivating it. The window can be widened by a variety of techniques, including techniques described elsewhere in this specification, for example. The widening of the window may, for example, comprise etching back surfaces of all layers of a multilayer resist covering surrounding the window (and defining it). In embodiments utilising a two-layer resist covering, the lower layer may be etched back to a greater extent than the upper layer in this widening process, so forming an undercut if none existed already, or deepening the undercut if one was already present in the structure. Thus, in certain embodiments the widening of the window further comprises forming an undercut or deepening an undercut in the covering of resist material.

In certain embodiments of the first aspect and the second aspect of the invention, the method further comprises forming an undercut in the layer of semiconductive material extending underneath the gate terminal from an edge of the gate terminal, and forming an electrical track extending from the gate terminal and over said edge, whereby the undercut in the layer of semiconductive material prevents electrical contact between the electrical track and the layer of semiconductive material.

This undercutting of the semiconductive material can be achieved in a variety of ways. For example, a mask can be formed over the manufactured structure, such that an etchant can access just the portion of the semiconductor layer to be removed. Thus the mask can be arranged so as to prevent access of the etchant to the portion of the semiconductive layer forming the conductive channel between the source and drain.

Another aspect of the invention provides a method of forming an electrical circuit comprising a plurality of transistors, the method comprising: forming each said transistor on a common substrate using a method in accordance with either the above-mentioned first aspect or second aspect of the invention; and forming interconnections between these transistors.

Another aspect of the invention provides a transistor manufactured using a method in accordance with any aspect of the invention. Another aspect of the invention provides an electrical circuit manufactured using a method embodying the invention.

Further aspects of the invention provide: an electronic circuit or logic gate comprising at least one transistor embodying the invention; a programmable transistor array comprising a plurality of transistors, each manufactured by a method embodying the invention, and having been formed on a common substrate; and a programmable logic array comprising a plurality of logic gates, each logic gate comprising at least one respective transistor manufactured by a method embodying the invention, and wherein the respective transistors are formed on a common substrate.

In certain embodiments, the array further comprises a covering of dielectric material formed over the plurality of transistors formed on the common substrate.

In certain embodiments, the array further comprises a plurality of windows formed in the covering of dielectric material to expose a plurality of terminals of the plurality of transistors so as to enable selected interconnections to be made between the exposed terminals.

Another aspect provides an electronic circuit comprising an array in accordance with one of the above-mentioned aspects, and a plurality of electrical tracks arranged to provide interconnections between selected transistor terminals.

Another aspect provides a method of forming an electronic circuit, the method comprising manufacturing an array of a plurality of transistors on a common substrate using a method in accordance with any other aspect, forming a covering of dielectric material over the array of transistors, forming a plurality of windows in the covering of dielectric material, each window exposing at least a portion of a terminal of a respective transistor, and selectively forming interconnections between said exposed portions of terminals. In certain embodiments, the selective formation of interconnections comprises printing conductive material. Another aspect provides an electronic circuit manufactured using this method.

Another aspect of the invention provides a regular array of transistors or logic gates which can be programmed to create a particular electrical circuit, such that the fabrication of the regular array is the same for each circuit but different functionalities can be chosen through programming. The programming can be achieved by designing a mask, such as a photomask, to selectively open up certain terminals (source, drain, gate, voltage rail, etc.) to create a particular circuit. Alternatively, a standard mask may be used, such as an imprint tool with regular features or a photomask, which opens-up all the possible terminals available for programming. The circuit can then be selected by depositing conductive material, e.g. by jet-printing of conductive ink such as nanoparticulate silver, into the desired terminals to create the functional circuit required. An alternative method uses laser-writing or maskless lithography to create windows in a resist material and in-filling the windows with conductive material. In this case the resist may be used as a lift-off mask to remove unwanted conductive material or a solution-based infill may equally be employed.

A further method provides via-holes over the terminals areas, either by selective drilling (e.g. micro, laser) of the desired vias for the circuit or by opening-up every available programmable terminal. In the first case conductive material may be used to fill-in the vias (e.g. evaporation, solvent deposition, sputter-coating) which may be connected together by printing, e.g. jet, gravure, etc. In the second case the vias may be created by a regular imprint tool or photomask or by drilling (e.g. micro, laser). All the vias may be filled with conductive material using solution deposition, vacuum, vapour deposition, coating or electroplating/electroless plating up from the conductive material on the terminal. Chemical vapour deposition is also possible, for example Cuprase-lect™, a commercial material available from Air Products, may be used to selectively deposit copper onto conductive areas leaving insulating areas uncoated. This may equally be employed to fill-in via-holes. Again, the via-holes may be used to program or select a circuit for a particular application using printing methods such as gravure, jet or flexo, amongst others. Alternatively a multi-level imprint such as described in GB915250.5 may be used to create a standard array of potential interconnections between terminals of the regular transistor or logic array. The imprinted structure may then be filled with conductive material to create all possible interconnections. The final step of programming may be to disconnect undesired interconnections for example using fuse-burning or laser-ablation of undesired interconnection wires. Other programming and interconnection methods are described in GB920563.4, and GB915250.5, the contents of each of which are incorporated by reference herein.

A further aspect of the invention provides a method comprising: providing a substrate with a layer of first dielectric material deposited beneath a first conductive layer, which has been patterned; and creating a small curtain around the outside of the first conductive layer of less than 200 nm. The dielectric may be selected such that it has different chemical functionality to the resist material, for example the dielectric may be hydrophobic and the resist may be hydrophilic. The method further comprises depositing the resist material and creating a window in the resist material to expose an area of the first conductive layer. The exposed conductive layer is etched away until the first dielectric material is exposed and then the window is slightly widened so as to expose a small additional area of conductive material. The substrate and resist material have substantially similar surface properties such that they both repel subsequent deposition of a semiconductive layer. The semiconductive layer only deposits over the exposed first conductive layer and the exposed regions of first dielectric material, but not on the substrate or resist material. A further step involves deposition of a second dielectric layer which does adhere to the resist material and substrate. This adhesion may be achieved by the process itself, e.g. plasma deposition, modifying the surface so as to promote adhesion or by removal of a surface coating which has been used to repel the semiconductive layer or by other means such as corona treatment, piranha-etching, etc. Additionally the resist material may have been additionally etched to widen the window and may have an undercut to ensure the second dielectric layer does not form a continuous film over the entire substrate. The second dielectric layer thus extends over the exposed semiconductor layer such that the semiconductor layer is completely covered or passivated. A second layer of conductive material is then deposited directly onto the second dielectric material. The resist material is then removed for example by solvent stripping.

It will be appreciated that further advantages provided by embodiments of the invention include the following. Certain embodiments of the invention provide methods which are capable of producing transistors (i.e. switching devices) having nanoscale dimensions, and devices (e.g. logic gates) and circuits incorporating such nanoscale transistors. Certain embodiments are able to provide manufacturing methods which themselves provide a pathway to smaller device features beyond photolithographic techniques. Certain embodiments provide methods in which a sequence or series of the method steps to manufacture transistors may be performed without breaking vacuum, thereby providing the advantage that the cleanliness and integrity of interfaces between different materials is maintained. For example, rf magnetron coating may be used to successively deposit layers of zinc oxide (semiconductor), aluminium oxide (dielectric) and indium tin oxide (gate electrode).

It will be further appreciated that certain embodiments involve opening a window so as to expose areas of substrate not covered by a first conductive layer. Such areas may be used to create multi-layer structures such as semiconductor-insulator-metal or metal-insulator-metal, which may have use as capacitors or resistors, either in isolation or by arranging such multi-layer structures alongside other multi-layer structures. It will be further appreciated that such structures may be arranged in a variety of different shapes and sizes so as to enable further connection with transistors or other components such as resistors, capacitors, voltage rails, etc. For example a loop structure may be formed consisting of one or more concentric loops with semiconductor-insulator-metal. Such a loop structure may be configured as an antenna, though typically its thickness will be too small to function efficiently. Further steps, however, may take advantage of such loop configurations to grow additional conductive material, e.g. by electroplating, using the existing material as a "seed-layer". It will be appreciated that such antenna-structures, such as loops, may be used to detect electromagnetic radiation, such as radio-frequencies. It will further be appreciated that they could form part of a radio-frequency detection system such as a tag. Incorporation of memory, such as transistor-memory, could additionally allow the creation of radio-frequency identification tags (rfid). The approach is not limited to just loop designs and it will be appreciated that many other antenna designs could be incorporated.

A further aspect of the invention allows for the creation of a window over a first conductive layer which has interdigitated features or fingers. Such a structure could be used to pattern the first conductive layer so as to create interdigitated source and drain regions. Further etching of a resist would allow some of the unetched areas of the first conductive layer to be exposed, in particular over a gate area. Successive deposition of semiconductor, dielectric and second conductive layer could then be used to create a transistor with interdigitated source/drain regions. This type of configuration has certain advantages in providing compact design for large transistor channel lengths and reducing the amount of first conductive layer that is to be etched.

A further aspect of the invention provides a transistor comprising
  a substrate;
  a source terminal and a drain terminal, each said terminal being supported by the substrate, and the source and drain terminal being separated by a portion of the substrate;
  a layer of semiconductive material deposited so as to cover said portion of the substrate and to connect the source terminal to the drain terminal;
  a layer of dielectric material deposited so as to cover at least a portion of said layer of semiconductive material; and
  a layer of electrically conductive material deposited so as to cover at least a portion of the layer of dielectric material, the layer of electrically conductive material providing a gate terminal to which a potential may be applied to control a conductivity of the layer of semiconductive material connecting the source and drain terminals.

In certain embodiments, each of the source and drain terminals comprises a respective plurality of fingers, and the fingers of the source terminal are interdigitated with the fingers of the drain terminal such that the semiconductive layer provides a meandering channel between the source and drain terminals.

In certain embodiments, the gate terminal is arranged to cover at least a portion, and optionally all, of the meandering channel. As will be appreciated, the gate terminal may, in such embodiments, be arranged to cover the interdigitated fingers of the source and drain terminals as well, and may be provided, for example, by a rectangular area of conductive material.

BRIEF DESCRIPTION OF THE DRAWINGS

Embodiments of the invention will now be described with reference to the accompanying drawings, of which.

DETAILED DESCRIPTION OF EMBODIMENTS OF THE INVENTION

Referring now to FIG. 1, this illustrates stages or steps in a first method embodying the invention for manufacturing a transistor, which may be referred to as a thin film transistor. The method comprises a step of providing a substrate 1 and a region of electrically conductive material 2 supported by the substrate. The resultant arrangement is shown in FIG. 1A. Here, the region 2 can also be described as a layer of electrically conductive material, or a pad. In this embodiment, the region 2 does not cover the entire upper surface of the substrate 1, but just a selected portion of it. It will be appreciated that, although FIG. 1 shows the formation of just a single transistor including source and drain regions formed from a single conductive pad or region 2, in alternative embodiments an array of a plurality of transistors may be formed on a common substrate 1, each transistor being formed to incorporate source and drain regions from a respective one of a plurality of pads. It will also be appreciated that the conductive region 2 shown in FIG. 1A may be formed on the substrate surface using a variety of techniques known in the art.

Figure 1A:
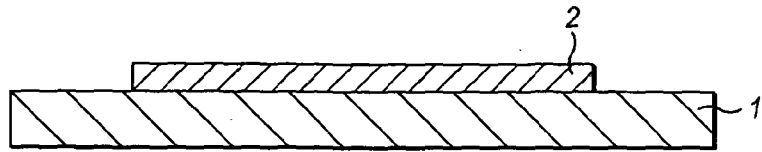
FIG. 1 is a schematic representation of steps in a method of manufacturing a transistor embodying the present invention.
Figure 1B:
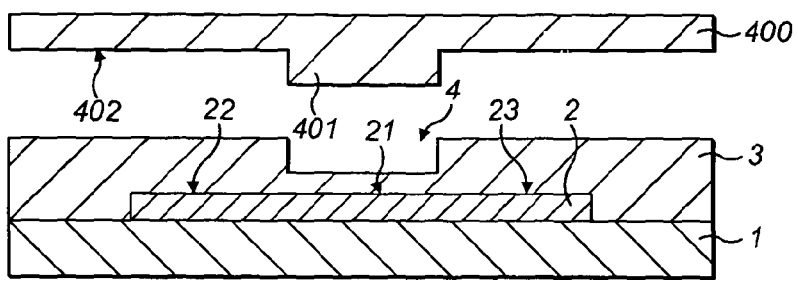

After providing the conductive region 2 on the substrate 1, a covering 3 of resist material is formed over the conductive region 2, to encapsulate it, and a depression 4 is formed in a surface 34 of the covering 3. In this first embodiment, the depression 4 is formed at the same time as the covering 3 of resist material is formed, and the resist material of the covering 3 is a UV curable polymer. The depression 4 has been formed by using an imprint tool 400, having an imprint feature 401 raised above a base surface 402. The resist covering 3 has been formed with the imprint tool 400 positioned with respect to the substrate and conductive region 2 and the resist material 3 has then been cured by application of UV light through the imprint tool or mask 400 (which is transparent to UV). The imprint tool 400 has then been separated from the structure, as shown in FIG. 1B. The depression 4 extends over a first portion 21 of the conductive region 2, and this first portion 21 separates a second portion 22 from a third portion 23 of the region 2. The second portion 22 will form the source of the transistor, and the third portion 23 will form the drain.

Figure 1C:
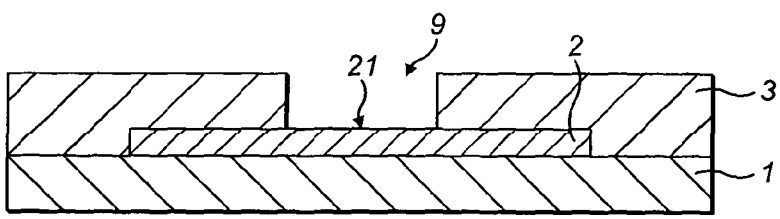
Figure 1D:
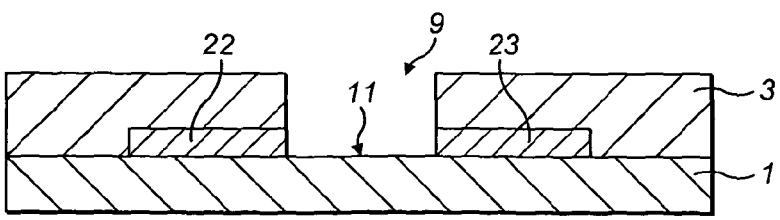

After forming the resist covering 3 and depression 4, resist material located under the depression 4 is then removed by a suitable technique (e.g. etching) to form a window 9 through the covering 3 and which exposes the first portion 21 of the region 2. The resultant arrangement is shown in FIG. 1C. Next, this first portion 21 of conductive material is also removed, such that the window 9 now extends through the covering 3 and the conductive region or pad 2, to a surface of the substrate 1 as shown in FIG. 1D. Thus, a portion 11 of the substrate is exposed, this exposed substrate portion separating the source and drain regions 22, 23. Thus, the window 9 defines a gap between the source and drain.

Figure 1E:
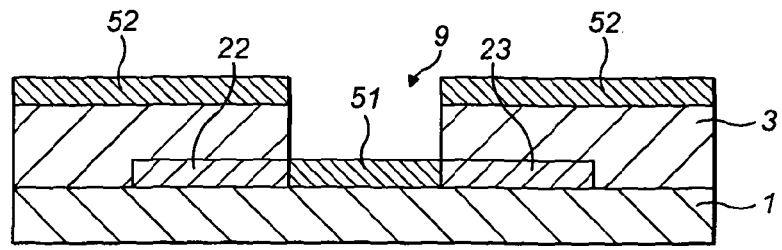

Next, semiconductive material is deposited over the structure shown in FIG. 1D, to produce the structure shown in FIG. 1E. This semiconductive material has formed a layer of semiconductive material 51 inside the window 9 and which connects the second portion 22 to the third portion 23. The deposited semiconductive material has also formed layers or coatings/coverings 52 on top of the resist material around the window.

Figure 1F:
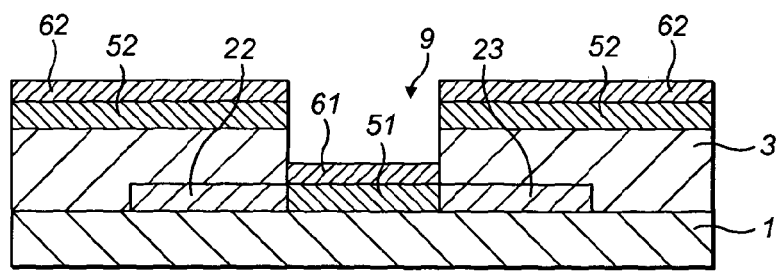

Next, dielectric material is deposited on the structure shown in FIG. 1E, to form the structure shown in FIG. 1F. The dielectric material forms a layer of dielectric material 61 (a gate dielectric layer) over the layer of semiconductive material 51 inside the window, and the dielectric material forms corresponding covering layer 62 on those layers 52 of semiconductive material on top of the resist covering around the window.

Figure 1G:
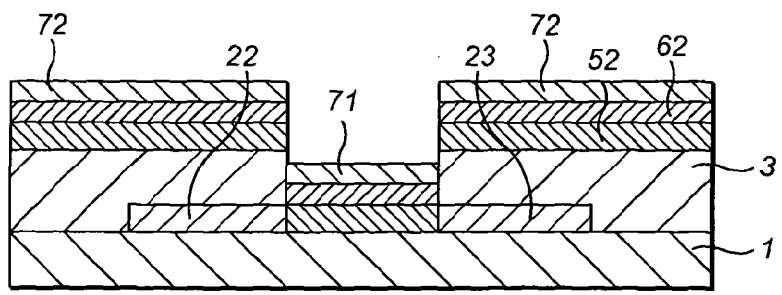
Figure 1H:
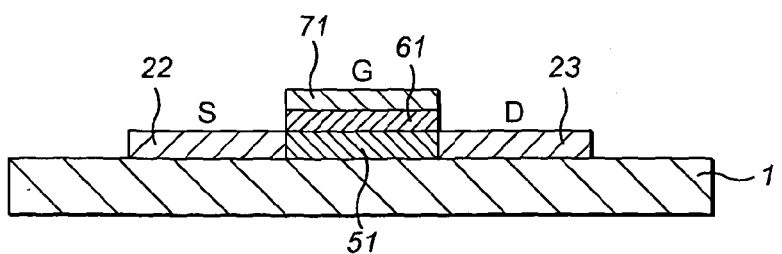

Next, electrically conductive material is deposited on the structure shown in FIG. 1F, to produce the structure of FIG. 1G. This deposited electrically conductive material forms a layer of electrically conductive material 71 on top of the dielectric and semiconductive layers 61, 51 inside the window 9, and again forms corresponding layers 72 of conductive material on top of the layers 62, 52 overlaying the resist covering around the window. Thus, both inside the window 9 and on top of the resist covering around the window, a three-layer structure or stack is formed, comprising a bottom layer of semiconductor, a middle layer of dielectric, and a top layer of conductive material.

Next, the remaining resist material of the covering 3 is removed from the substrate by a suitable technique. By removing the resist material around the window 9, the surrounding layers 52, 62 and 72 are also lifted off the structure, to leave the structure shown in FIG. 1H.

As will be appreciated, this structure comprises a transistor having a source, drain, and connecting conductive channel 51 supported on a surface of the substrate 1. A gate terminal 71 is separated from the semiconductor layer 51 by a gate dielectric 61, and application of a potential to the gate is able to control conductivity of the semiconductive channel 51 between the source and drain.

In this first embodiment, the thickness of the layer of semiconductive material 51 is substantially equal to the thickness of the source and drain terminals 22, 23, although it will be appreciated that in other embodiments the relative thicknesses may be different, for example the semiconductive layer 51 may be thicker than, or thinner than the source and drain regions.

Referring now to FIG. 2, this shows another method embodying the invention and for manufacturing a field effect transistor. In this second embodiment, a region or pad 2 of electrically conductive material is again formed on a substrate 1. For simplicity, FIG. 2 only shows the portion of substrate 1 underneath the conductive region 2, and it will be appreciated that in certain embodiments the conductive region 2 will not cover the entire substrate 1, instead covering just a portion of it. In this second embodiment, a covering 3 of resist material is again formed over the conductive region or pad 2, but this time the covering 3 comprises a first layer 31 of lift-off resist material formed directly over the conductive region 2, and a second layer 32 of imprintable resist material formed over the first layer 31. Thus, the resist covering 3 comprises layers of different resist materials, having different properties.

In this second embodiment, after forming the resist covering 3, a depression 4 is formed in an upper surface 34 of the top layer 32 of imprintable resist material. In alternative embodiments, the depression 4 may be formed at the same time as forming the upper layer 32 of resist material. For example, in certain embodiments the conductive region 2 may be one of a plurality of conductive pads deposited onto the substrate 1 at selected positions using a first mask. Over that structure, a layer of lift-off resist material can be formed by spin-coating. Then, an imprint tool, which can be regarded as a second mask, can be aligned with respect to the conductive metal pad or pads 2 and the second layer 32 of resist material, incorporating the depression or depressions 4 can be formed with the second mask in position over the conductive pads. As described above, the material for the upper layer 32 of resist can be UV curable material.

Figure 2A:
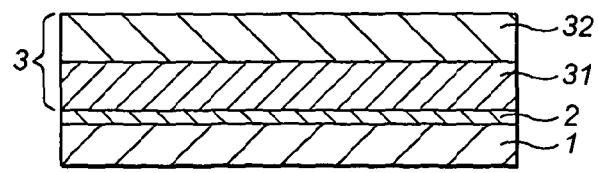
FIG. 2 is a schematic representation of steps in another method embodying the invention and for manufacturing a transistor.
Figure 2B:
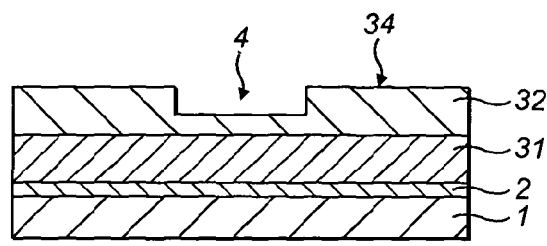
Figure 2C:
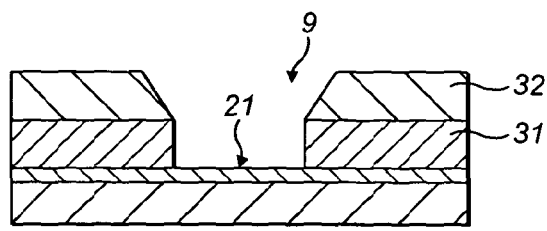

Returning to the embodiments shown in FIG. 2, after producing the structure shown in FIG. 2B by suitable techniques, a window 9 through the resist covering 3 to the underlying conductive material is formed by a suitable technique (e.g. by etching) so as to expose a portion 21 of the conductive layer. The resultant structure is shown in FIG. 2C. As can be seen, the sides of the upper and lower resist layers defining the window 9 have different profiles. In general, these profiles are a function of the shape of the imprint tool used to form the depression 4 and the technique used to form the window 9 (e.g. with wet etching). In the illustrated embodiments, the edges or sides of the lower layer 31 are generally perpendicular to the underlying conductive layer, whilst the sides of the upper layer 32 are angled.

Figure 2D:
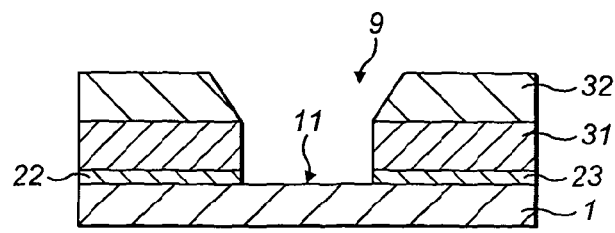
Figure 2E:
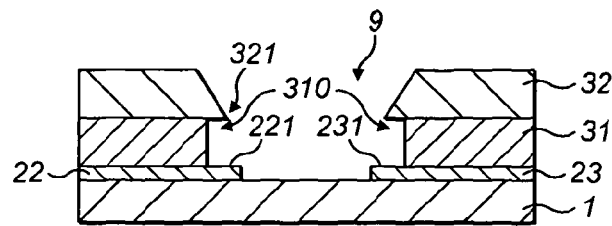

Next, the exposed portion 21 of conductive material (e.g. Al, Cr or ITO) is removed by a suitable technique (e.g. wet or dry etching of Al, Cr or ITO). This etching step thus defines the source and drain terminals 22, 23 as shown in FIG. 2D. Next, a further etch is performed using a technique which exploits different etch rates of the lift-off resist material and imprintable resist material of the two layers 31, 32. This etching widens the window 9 as the edges 321 of the upper layer 32 recede, and at the same time results in undercuts 310 being formed in the lift-off resist layer 31 which etches at a faster rate. Thus, by forming these undercuts 310 and by widening the window 9, portions or parts 221, 231 of the upper surfaces of the source and drain regions 22, 23 are exposed, and these exposed portions 221, 231 are just partially shadowed by the overhanging edges 321 of the upper resist layer 32.

Figure 2F:
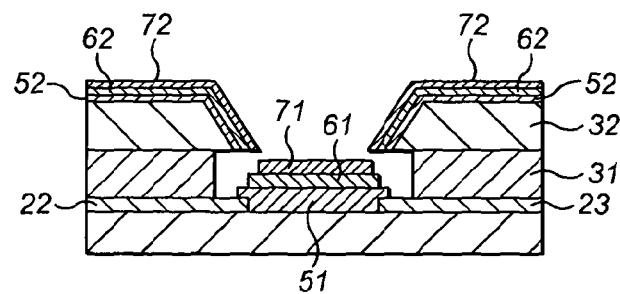

Next, as with the first embodiment described above, successive layers of semiconductive material 51, dielectric material 61, and conductive material 71 are deposited inside the window 9, together with corresponding layers 52, 62, 72 on top of the upper resist layer 32. The resultant arrangement is shown in FIG. 2F. As will be appreciated, by widening the window 9 and forming the undercuts 310 in the lower resist layer 31, the deposition of these three layers results in the semiconductive layer 51 at least partly overlapping (i.e. overlaying, covering) the exposed portions 221, 231 of the source and drain upper surfaces, and also results in the three layers 51, 61, 71 having progressively smaller areas as a result of the increased shadowing provided by the layers 52, 62 and 72 built up around the edges of the window 9. The overlapping of the semiconductive layer 51 onto the source and drain regions provides improved electrical connection between the source and drain and semiconductive material.

Figure 2G:
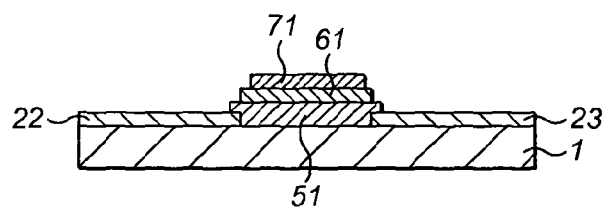
Figure 2H:
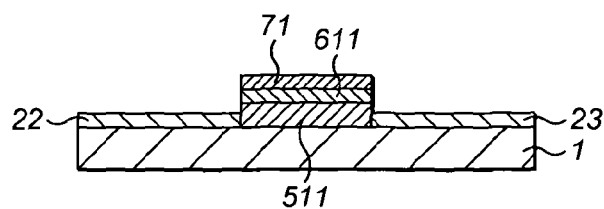

Next, the remaining resist material is removed by a suitable technique. In certain embodiments, this can be described as developing the lift-off resist material. The resultant structure is shown in FIG. 2G. As with the first embodiment, a field effect transistor has again been produced, but this time with the semiconductive material at least partly overlapping the source and drain terminals 22, 23. In certain embodiments, the method may comprise a further step of trimming the semiconductive material and gate dielectric material not directly under the gate terminal 71. This can be achieved by using the gate 71 as a mask and etching the dielectric and semiconductive materials using an appropriate technique. Such trimming results in the arrangement shown in FIG. 2H.

It will be appreciated that the above-described methods may be used to manufacture one or a plurality of transistors on a common substrate, and contacts to and interconnections between these transistors may be formed using suitable techniques, for example by imprinting or photolithographic techniques employing a third mask for example.

Referring now to FIG. 3, this illustrates part of another method embodying the invention. In this embodiment, a window 9 is again formed in a multi-layer resist covering and conductive pad to expose a separating portion 11 of substrate, between a source terminal 22 and drain terminal 23, as shown in FIG. 3A. As in the embodiment of FIG. 2, the resist covering 3 is etched to widen the window 9 and produce undercuts 310 in the lower resist layer 31 to expose portions 221, 231 of the source and drain regions. The resultant arrangement is shown in FIG. 3B, and overhanging portions 320 of the upper layer 32 of resist can be seen, with edges 321, those overhanging portions 320 partially shadowing the exposed portions 221 and 231. In this embodiment, a further step is performed, which can be regarded as a partial etch, to form steps 222 and 232 in the exposed portions of the source and drain terminals 22, 23. This partial etch to form the steps is achieved by using the overhanging upper resist layer 32 as a mask. In other words, the edges of the steps generally correspond to the positions of the edges 321 of the upper layer 32.

Next, semiconductive material, dielectric material, and conductive material are sequentially deposited to form the multi-layer structure 51, 61, 71 inside the window 9, and the corresponding layers on the resist covering. As will be seen in FIG. 3D, the semiconductive layer 51 connecting the source and drain has a thickness substantially equal to the thickness of the source and drain regions, and covers (overlaps) the steps 222, 232 to improve contact between the source and drain and the semiconductor. The gate dielectric 61 covers a slightly smaller area than the semiconductive layer 51 by virtue of the shadowing provided by the layer of semiconductive layer 52 formed on top of the resist structure. Similarly, the gate 71 occupies a smaller area than the gate dielectric layer as a result of the shadowing provided by the layer of dielectric material 62 formed around the window 9.

Figure 3A:
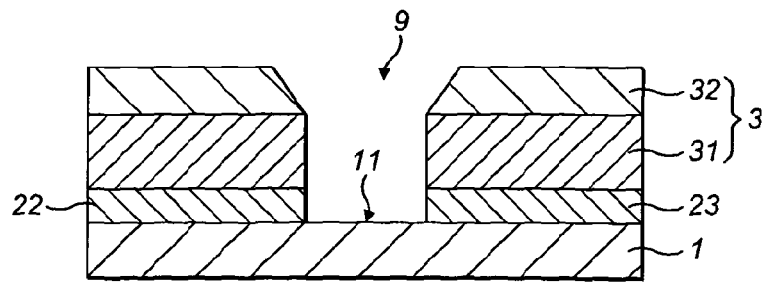
FIG. 3 is a schematic representation of steps in another method of manufacturing a transistor embodying the invention.
Figure 3B:
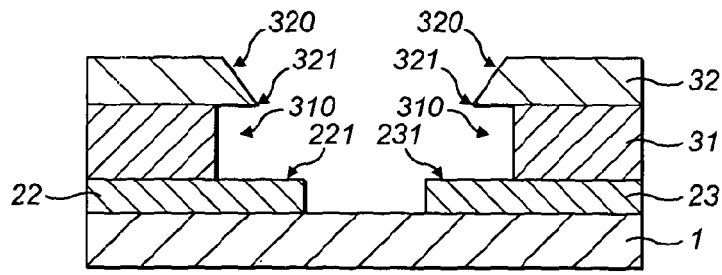
Figure 3C:
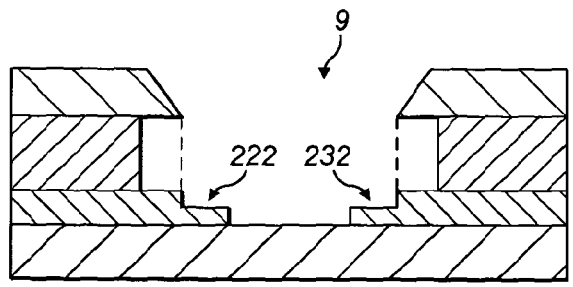
Figure 3D:
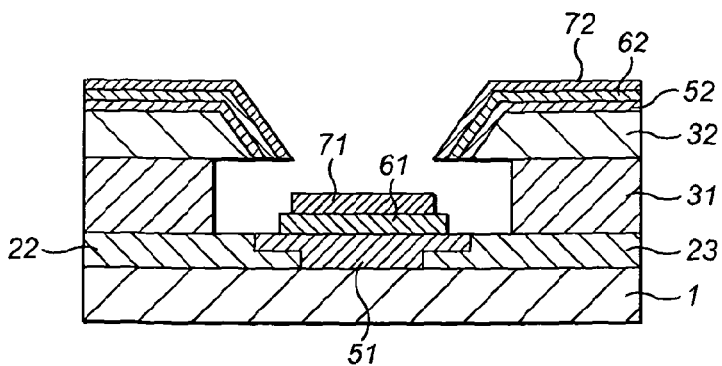
Figure 3E:
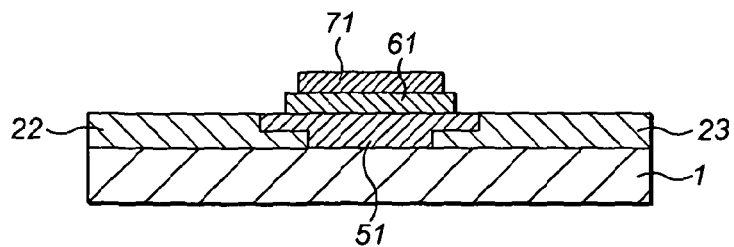

Next, the lift-off material of the layer 31 is developed, which in turn lifts off the layers 52, 62 and 72, leaving the structure shown in FIG. 3E.

Figure 4:
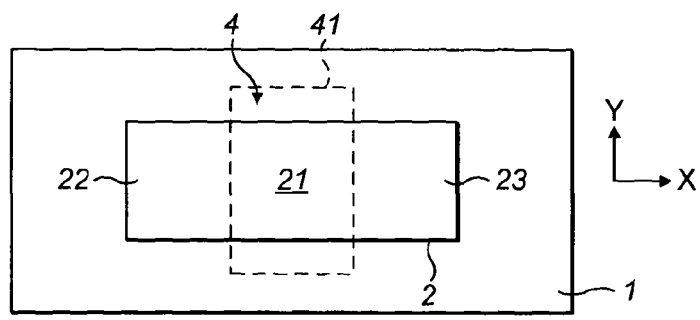
FIG. 4 illustrates the positioning of a depression with respect to a conductive region on a substrate in a method embodying the invention.
Figure 5:
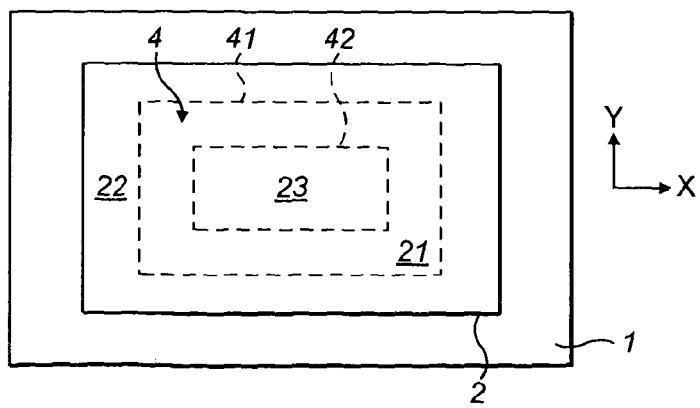
FIG. 5 is a schematic representation of the positioning of a depression with respect to a conductive region supported by a substrate in another method embodying the invention.
Figure 6:
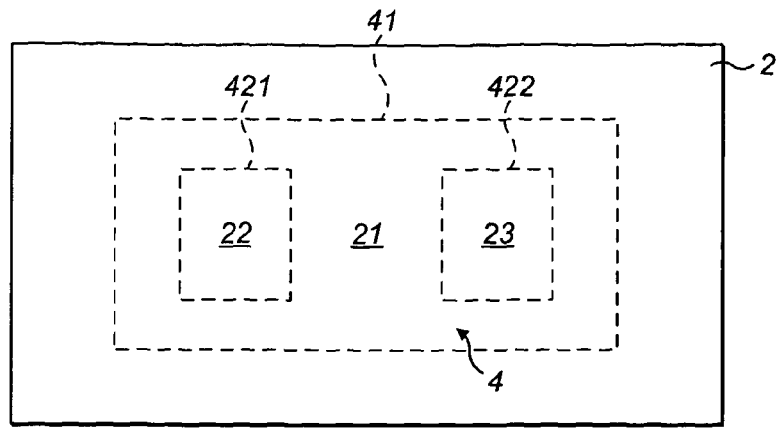
FIG. 6 is a schematic representation of the positioning of a depression with respect to an electrically conductive region completely covering a substrate in another method embodying the invention.

As will be appreciated, in embodiments of the invention the depression formed in the resist covering is arranged to extend over (i.e. cover) a portion of the electrically conductive material which, when removed, results in separate source 22, and drain 23 terminals being produced or defined. FIGS. 4, 5, and 6 schematically illustrate three different arrangements of depression position with respect to conductive material which may be used in embodiments of the invention. In FIG. 4, the depression is generally rectangular, having a perimeter 41, and the depression is arranged to completely cover a first portion 21 of a conductive pad 2 supported by a substrate 1 when a window is formed through a resist covering and conductive material inside the window is removed, this results in the formation of source and drain 22, 23 which are separated generally in the X direction shown in the figure. As will be appreciated, in order to result in complete separation of the source 22 from drain 23 region, there is some flexibility in the precise positioning of the depression perimeter 51 with respect to the pad 2. In other words, there is a substantial tolerance in the positioning of the depression in both the X and Y directions. Provided that the depression is located with sufficient accuracy that the source and drain regions are completely separated, the correct alignment of the subsequent semiconductive layer, gate dielectric and gate electrode itself are all guaranteed. Although the depression in this example is generally rectangular, it will be appreciated that in other embodiments it may have a different shape. For example, in certain embodiments the depression may be arranged/shaped/structured so that the source and drain regions comprise inter-digitated "fingers", such as shown in FIG. 16, separated by a relatively long, meandering semiconductive channel in the eventual device. Thus, the depression may comprise a meandering portion.

Moving on to FIG. 5, this shows an alternative arrangement in which the depression 4 is substantially annular, having an outer perimeter 41 and an inner perimeter 42. The depression 4 thus covers an annular first portion 21 of the conductive pad 2, and when this first portion 21 is removed, this defines a central source or drain terminal 23, separated from and surrounded by a generally annular outer source or drain 22. Again, there is substantial flexibility in the precise positioning of the depression 4 with respect to the pad 2, and shifts in both its X and Y positions can be tolerated, provided that the underlying first portion 21, when removed, completely separates the source and drain terminals 22, 23.

Moving on to FIG. 6, this shows an alternative arrangement in which the region of electrically conductive material 2 completely covers the substrate 1. Here, the depression is arranged both to separate a source region 22 from a drain region 23, and also define the extents or limits of those regions within the conductive layer 2. Here, the depression 4 has an outer perimeter 41, a first inner perimeter 421 to define a source region 22, and a second inner perimeter 422 arranged to define a drain region 23. Thus, in this arrangement the depression defines, in a single step, the source region, the drain region, and the gap between them. It will be appreciated that methods embodying the invention such as those described above may be used to form a semiconductive layer connecting the source to the drain, with gate dielectric and gate itself on top. It will also be appreciated that further masking and etching techniques may be required to remove semiconductive, dielectric, and conductive material from around the source and drain terminals, i.e. from positions not corresponding to the conductive channel directly between the source 22 and drain 23.

Referring now to FIG. 7, this illustrates steps in another method embodying the invention. In this method, rather than using a depression position to define the gap between a source and drain formed from a common conductive pad or area, separate source and drain terminals or regions 22, 23 are provided on a supporting substrate 1. These separate source and drain terminals can be produced using a variety of techniques. For example, these source and drain contacts can be pre-patterned, together with interconnections underneath for connecting to other devices on the substrate, in method steps utilising various techniques, such as photolithography, imprinting techniques (such as two-level imprinting), and shadow-masking. The source and drain terminals 22, 23 formed on the substrate 1 are shown in FIG. 7A. For example, these conductive layers 22, 23 may be formed by selective deposition of conductive material at these positions, or by selective removal of conductive material between and around the source and drain terminals.

Figure 7A:
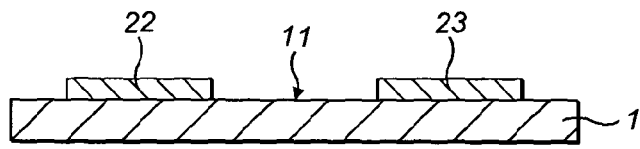
FIG. 7 illustrates steps in another method embodying the invention.
Figure 7B:
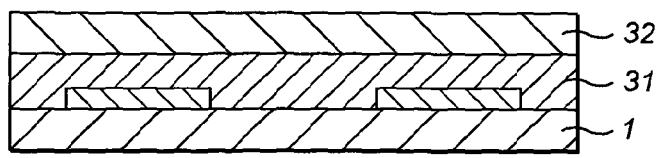
Figure 7C:
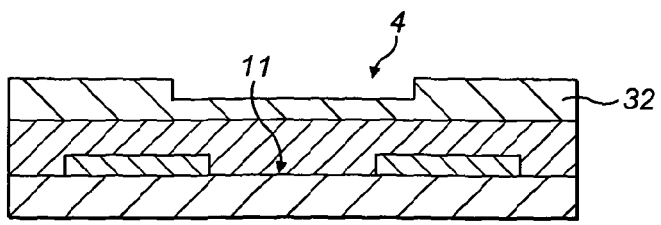
Figure 7D:
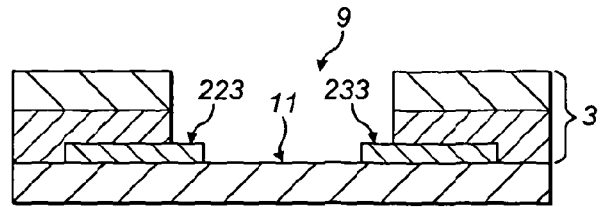

Next, a first layer 31 of lift-off resist material is deposited over the arrangement of terminals, and an upper layer of imprint resist material 32 is formed over the lift-off layer, as shown in FIG. 7B. Next, a depression 4 is formed in the upper resist layer 32 by suitable techniques, for example by imprint techniques, such as thermal imprinting or UV imprinting. This depression formation is performed in certain embodiments using a mask or imprint tool with the feature used to define the depression position being aligned to the source and drain (and to the gap between them). As can be seen from FIG. 7C this depression 4 is arranged so that it extends over the separating portion 11 of substrate and over respective portions 223, 233 of the source and drain terminals. After forming the depression 4, resist material is removed using appropriate techniques (for example by etching, using an oxygen plasma) to form a window 9 through the covering 3, exposing both the separating portion of substrate 11 and the portions 223 and 233 of the source and drain terminals. In certain embodiments, successive layers of semiconductive material, dielectric material, and conductive material may then be formed on the structure shown in FIG. 7D, before developing the resist material to form the eventual transistor. However, in the present embodiment, the window 9 is further widened and undercuts 310 are formed in the first lift-off layer 31 by suitable techniques (e.g. etching).

Figure 7E:
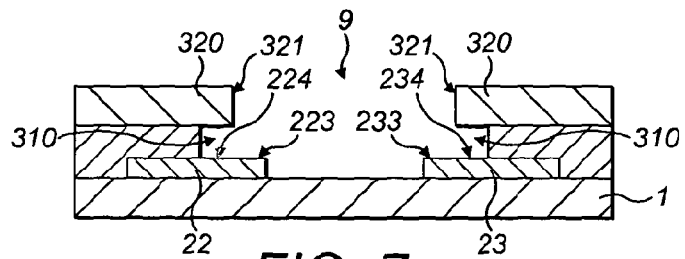

Thus, etching can be used to push back the edges 321 of the upper resist layer around the window, and to form the undercuts 310 in the lower resist layer, to leave portions 320 of the upper layer overhanging. In this way, in addition to the portions 223 and 233 of source and drain originally exposed when the window 9 was initially formed, further portions 224 and 234 are exposed, albeit shadowed underneath the overhanging portions 320 of the upper resist layer. The resultant arrangement is shown in FIG. 7E.

Next, a layer of semiconductive material 51 is deposited inside the window 9 to connect the source and drain, this deposition also resulting in layers 52 being formed over the upper resist layer 31. This semiconductive layer 51 overlaps the portions 223 and 233 of the source and drain, thereby giving improved electrical connection and charge transfer between the terminals and connecting semiconductive channel.

Figure 7F:
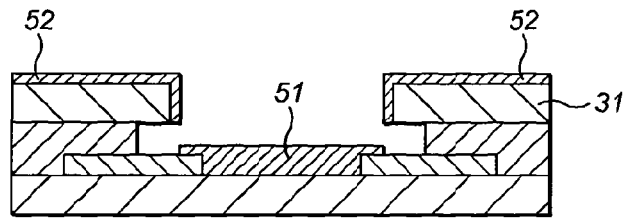
Figure 7G:
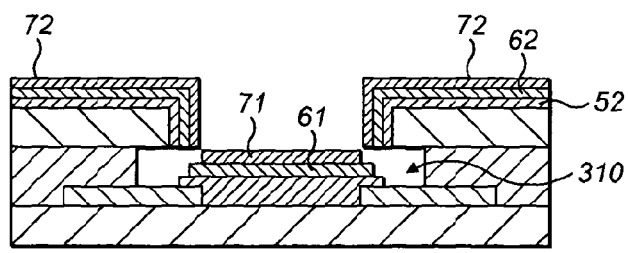
Figure 7H:
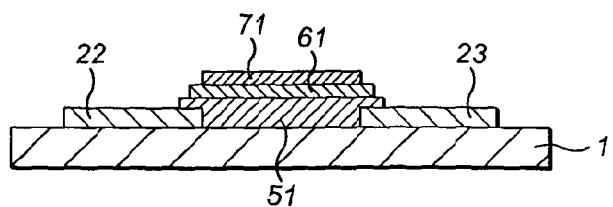

Next, the gate dielectric and gate layers 61 and 71 are built up on top of the structure of FIG. 7F, resulting in the structure shown in FIG. 7G. Again, it will be appreciated that the formation of the undercuts 310 provides the advantage that the layers of semiconductive material and dielectric material 61, 72 inside the window 9 are disconnected from the layers 52, 62 formed over the upper resist layer 31. This in turn assists in the lifting off of the resist layers and overlaying multi-layer structure 52, 62, 72 when the lift-off resist layer 31 is developed. Thus, the method also comprises the step of removing the lift-off material present in the structure shown in FIG. 7G, to yield the eventual device structure shown in FIG. 7H.

Figure 8A:
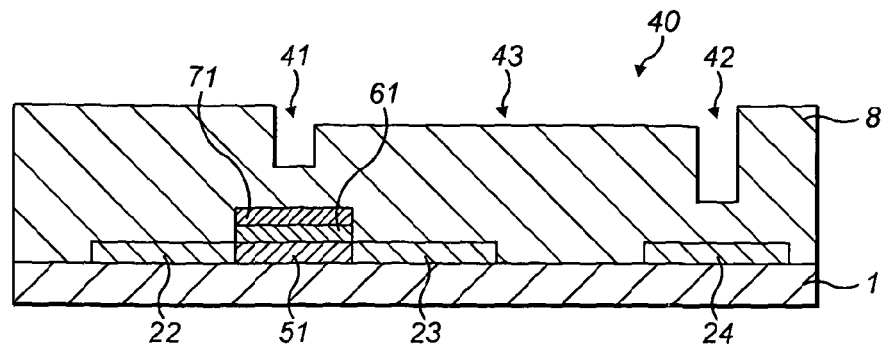
FIG. 8 is a schematic representation of steps in a method of manufacturing an electrical circuit in accordance with an embodiment of the invention.
Figure 8B:
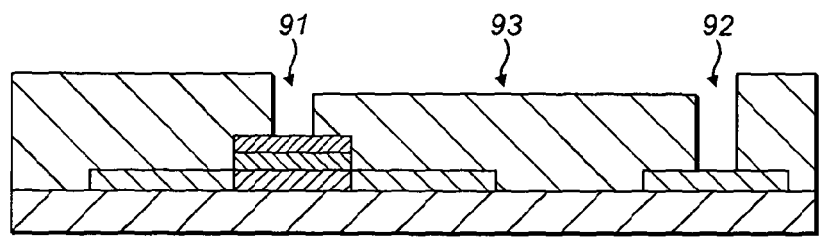
Figure 8C:
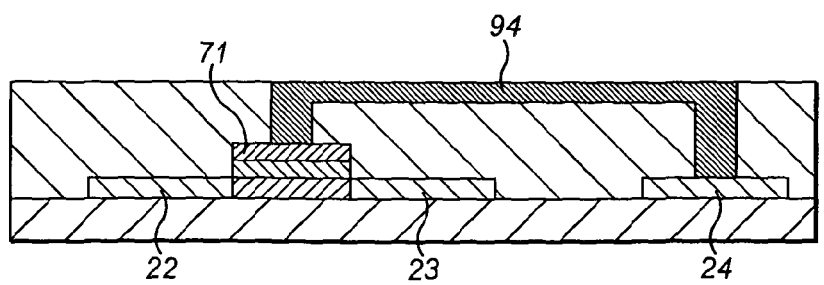

Referring now to FIG. 8, this shows part of another method embodying the invention in which an electrical connection is made between the gate terminal 71 of a transistor manufactured using an embodiment of the invention, and another portion of conductive material 24 supported by the substrate. It will be appreciated that this portion 24 of conductive material may be a terminal of another device formed on the substrate, it may be a conductive pad for making further electrical connections, it may be a ground rail, supply voltage rail, or any other conductive pad or track for incorporation in an electronic device or circuit. Referring to FIG. 8A, a thin-film transistor embodying the invention has been formed, comprising source and drain terminals 22, 23 connected by a semiconductive channel or layer 51, with a gate terminal 71 arranged over the semiconductive layer 51 and separated from it by a gate dielectric layer 61. A covering of dielectric material 8 has been formed over the transistor structure and the further conductive region 24, this dielectric covering 8 also having a depression 40 formed in its upper surface. In this example, the depression 40 does not have uniform depth. Instead, it comprises a first depression portion 41 having a first depth and arranged over the gate terminal 71, a second depression portion 42 having a second, deeper depth, and arranged over the further conductive portion 24. The depression 40 also comprises a third depression portion 43, having a shallower depth, and connecting the first and second depression portions 41, 42. As will be appreciated, the depression 40 in FIG. 8A may be produced using a variety of techniques, for example by imprinting using a multi-level imprint tool. After producing the structure shown in FIG. 8A, a suitable technique is used, e.g. etching, to remove dielectric material so as to develop the first depression portion 41 into a first hole 91 which extends through the dielectric layer 8 to the gate 71. The second depression 42 has been developed into a second hole 92 which extends through the layer 8 to the upper surface of the further conductive portion 24. The third depression portion 43 has also been developed so that it provides a channel, groove, recess or other such feature laterally (i.e. generally in a direction parallel to the substrate surface 1) connecting the first hole 91 to the second hole 92. Next, the holes 91 and 92 and the channel 93 are filled with electrically conductive material so as to form an interconnect 94 connecting the gate 71 to the further conductive region 24.

Figure 9:
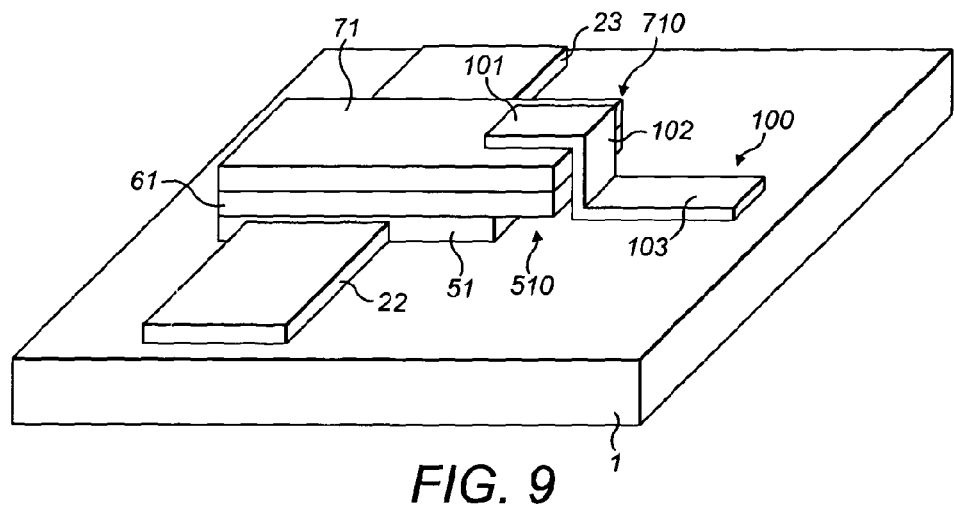
FIG. 9 is a schematic representation of a transistor embodying the invention, and produced by a method embodying the invention, having a conductive track electrically connected to and extending from its gate terminal.
Figure 10A:
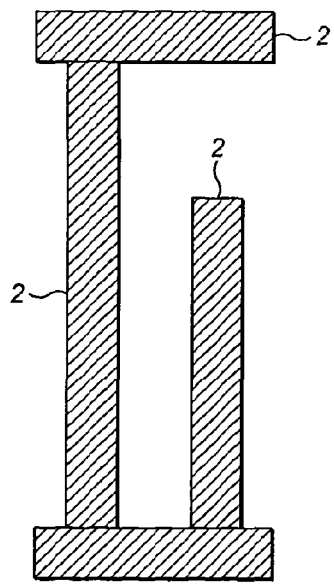
FIG. 10 illustrates a NOR gate incorporating a plurality of transistors and embodying the present invention, and steps in its manufacture.
Figure 10B:
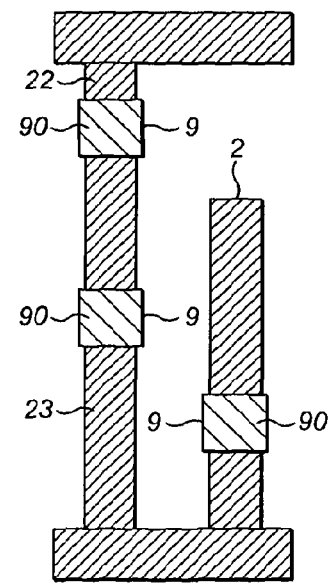
Figure 10C:
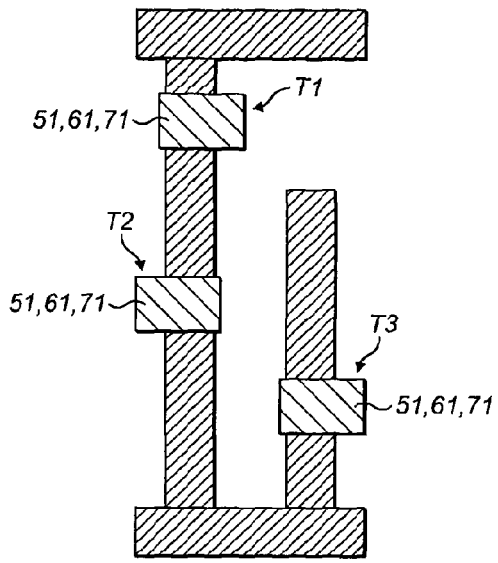
Figure 10D:
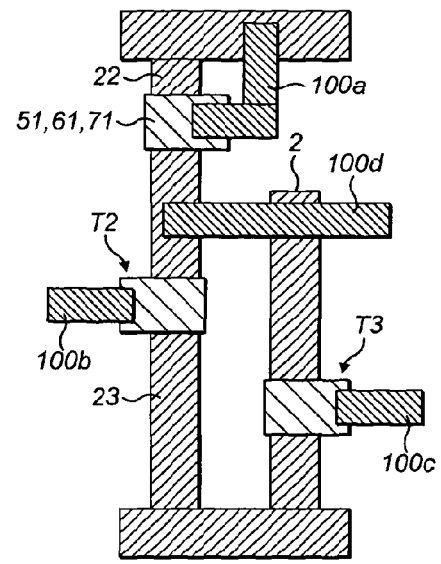
Figure 10E:
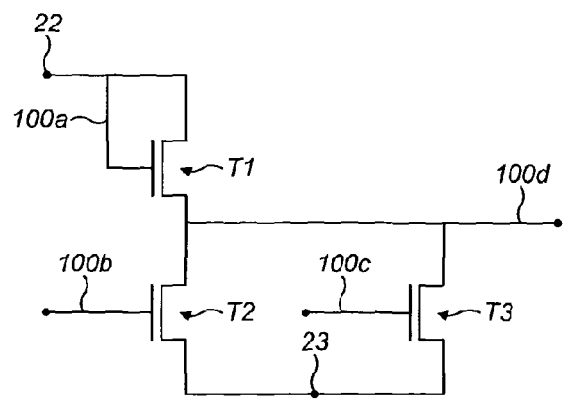
Figure 11A:
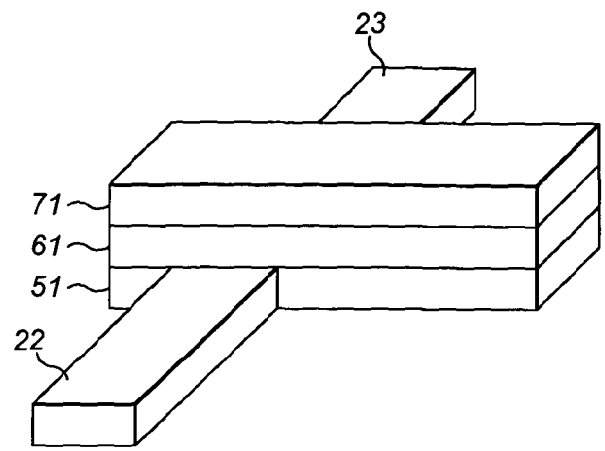
FIG. 11 illustrates steps in the formation of a gate contact to a transistor in an embodiment of the invention.
Figure 11B:
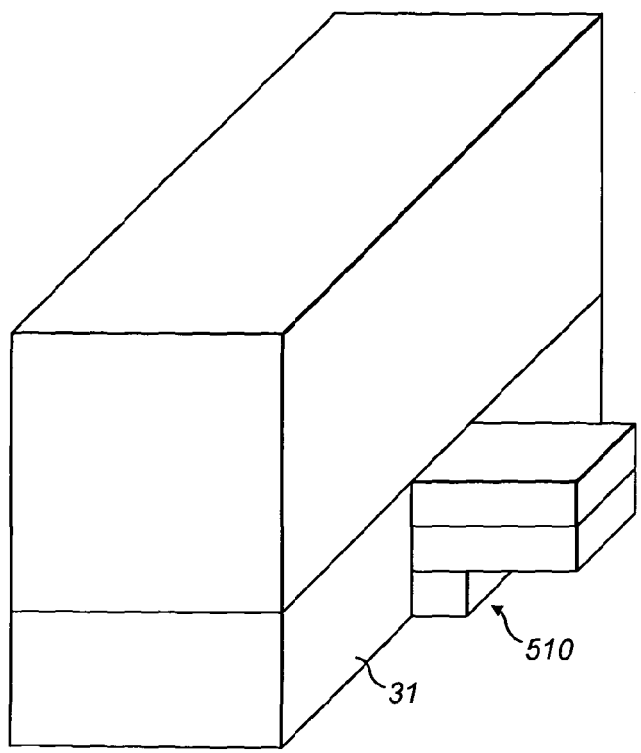
Figure 11C:
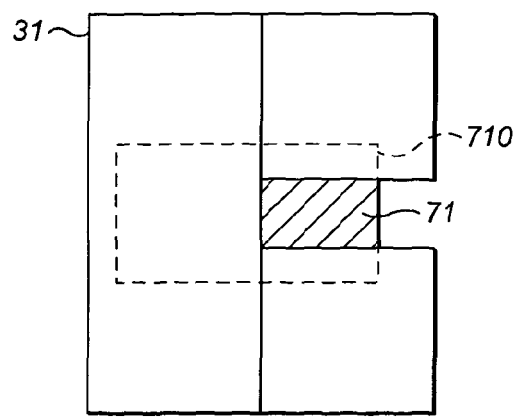
Figure 11D:
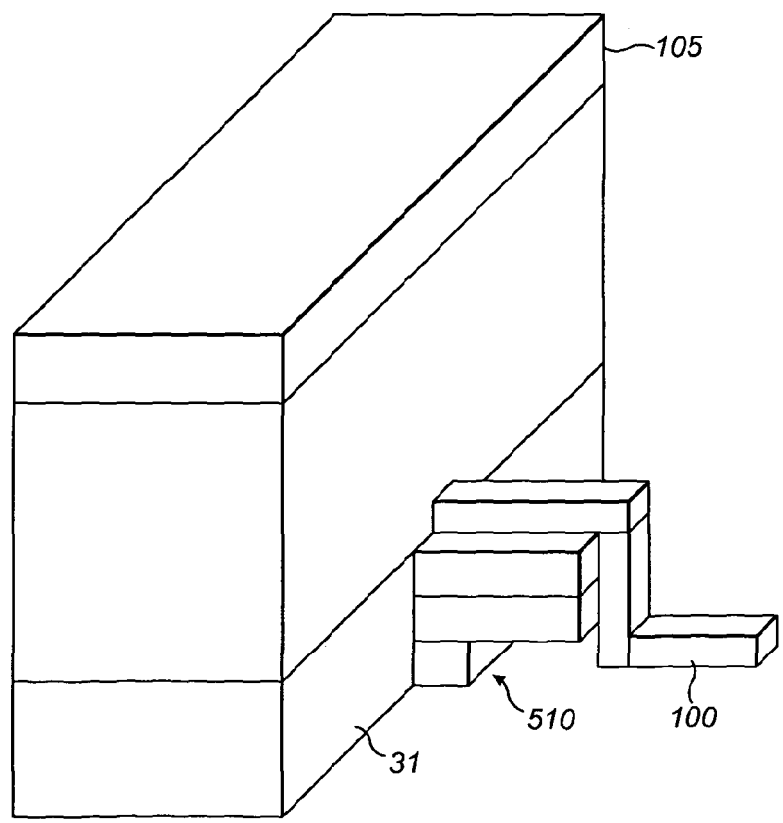
Figure 11E:
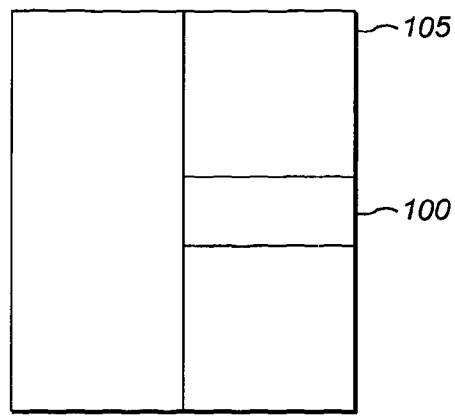
Figure 11F:
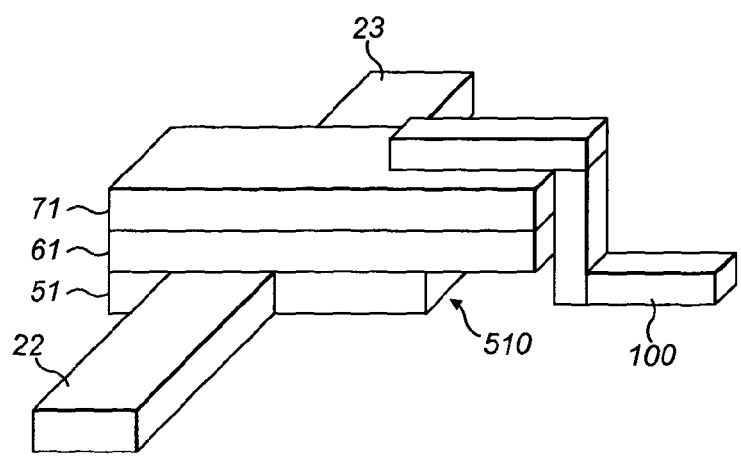

Referring now to FIG. 9, this shows a transistor which has been manufactured using a method embodying the invention. The transistor comprises source and drain regions 22, 23 supported on a substrate 1. A layer of semiconductive material 51 connects the source and drain, and a gate dielectric layer 61 and gate terminal 71 are arranged above the semiconductive layer. Additionally, an undercut 510 has been formed in the semiconductive layer 51, this undercut 510 extending beneath the gate layer 71 from an edge 710 of the gate terminal. A conductive track 100 has been formed on the structure, this conductive track comprising a first portion 101 in electrical connection with the gate 71, a third track portion 103 extending along a surface of the substrate 1, and a second, interconnecting portion 102 of the track connecting the first portion 101 to the third portion 103. As will be appreciated, the undercut 510 ensures that the conductive track 100 does not make direct electrical connection to the semiconductive layer 51. The undercut 510 has been formed before forming the conductive track 100. In certain embodiments, the conductive track can be formed by techniques such as printing, masking and selective deposition, and other suitable techniques. An example of a method suitable for forming the undercut 510 is described below, with reference to FIG. 11.

Referring now to FIG. 10, this shows a NOR gate embodying the invention and comprising a plurality of transistors formed on a common substrate using a method embodying the invention. FIG. 10A shows a region of electrically conductive material 2 supported by a substrate (not shown). FIG. 10B shows a later stage in which a resist (not shown) has been deposited and patterned with a depression by alignment of a UV imprint tool and subsequent irradiation with UV, the lower part of the depression has been removed by oxygen plasma etching so as to open a window 9 on the conductive material 2 and the conductive material within the window 9 has been removed to leave areas 90 which are now completely free of conductive material. Areas 22 and 23 define source and drain terminals of the logic-gate. FIG. 10C shows a later step in the method in which successive deposition of semiconductive, dielectric and conductive materials have created layers 51, 61 and 71 respectively to create three thin-film transistors, T1, T2, T3. The resist material around the layers 51, 61 and 71 has been removed in a subsequent step by a lift-off process. FIG. 10D shows a final stage where a mask, e.g. imprint, has been aligned to the thin-film transistors formed by layers 51, 61 and 71 and used to pattern a resist only exposing areas of the trilayer structure 51, 61, 71 away from the channel region between source and drain terminals. A conductive material has been deposited e.g. by vacuum evaporation, within the exposed areas and the resist material removed, e.g. by a lift-off technique, so as to leave a plurality of conductive tracks 100 providing gate contacts and interconnections. These conductive tracks 100 in this example comprise four conductive tracks, 100A, 100B, 100C, and 100D. Track 100A provides an interconnection between the nominal source and gate terminals of the first transistor T1. Track 100B provides a connection to the gate terminal of the second transistor T2. Track 100C provides a connection to the gate terminal of transistor T3. Track 100D provides an interconnection between the nominal drain of transistor T1 (which is also the nominal source of transistor T2) and the nominal source of transistor T3. FIG. 10E is a circuit diagram of the three transistors and their interconnections forming the NOR gate of FIG. 10D.

Referring now to FIG. 11, this shows a schematic of an undercut enabling interconnection of a plurality of thin-film transistors formed in a method embodying the invention. FIG. 11A shows a thin-film transistor formed by a method embodying the invention, such as described above with reference to FIGS. 1 to 7. FIG. 11B shows a further step where a mask has been used to pattern a layer of resist material 31 (a front portion covering layers 51, 61 and 71 has been partially removed for clarity) opening up a window in the resist over some of the trilayer structure defined by layers 51, 61 and 71. FIG. 11O shows a top-view of this arrangement where the exposed areas within the window extends beyond the boundary of layers 51, 61 and 71 in the horizontal direction but completely covers the edges of the three layers in the vertical direction. In FIG. 11C the perimeter 710 of the gate region 71 is shown in the form of a broken line. As can be seen, the resist layer 31 has been developed so as to expose just a portion of the upper surface of the gate layer 71. Referring back to FIG. 11B the next step is to produce an undercut 510 in the semiconductor layer 51, for example if layer 51 is zinc oxide, layer 61 is aluminium oxide and layer 71 is aluminium, then 51 can be easily undercut by etching with dilute acid, such as citric acid or ammonium chloride solution. Referring now to FIG. 11D, this shows a subsequent step where a conductive material 100 has been deposited over the entire substrate, for example by vacuum evaporation—the undercut 510 in semiconductor layer 51 ensures that the interconnect 100 does not contact the semiconductor layer. Additionally the layer of resist (as shown in FIG. 11C) covers the trilayer in the vertical direction such that conductive material 100 does not completely cover the trilayer 51, 61 and 71 in this direction, but laterally extends beyond the horizontal boundary. The undercut 510 ensures that there is no contact between conductive material 100 and semiconductive layer 51. Conductive material 105 also covers the remaining resist material 31—also shown as a top-view in FIG. 11E. FIG. 11F shows a final stage where the resist material 31 has been removed including the conductive material 105 which was deposited on top of the resist material 31.

Referring now to FIG. 12, this shows a regular array of thin-film transistors which have been fabricated in a method embodying the invention. FIG. 12A shows a top-view of an array of thin-film transistors comprising a trilayer of semiconductor, dielectric and conductive material 71 (only layer 71 is shown), with individual source areas 22 and shared ground areas 23. FIG. 12B shows a further step where a resist layer 31 has been deposited onto the substrate (not shown). FIG. 12C shows a further step where areas of resist layer 31 has been removed creating windows 9, such as by imprinting, laser-ablation, so as to expose areas of layer 71, substrate and source terminals 22. FIG. 12D shows a further step in which two of the exposed areas 9 have been filled-in with conductive material 100, e.g. by jet-printing of conductive ink, so as to select a particular circuit. Thus, a plurality of windows have been formed through the layer of resist material 31 which previously encapsulated the plurality of transistors/switching devices, and selected windows are then filled, at least partly (in other words a deposition of conductive material is made inside the windows) with conductive material to form selected interconnections between the devices. This can be regarded as programming or configuring an electronic circuit by forming selective interconnections between pre-formed transistors.

Figure 12A:
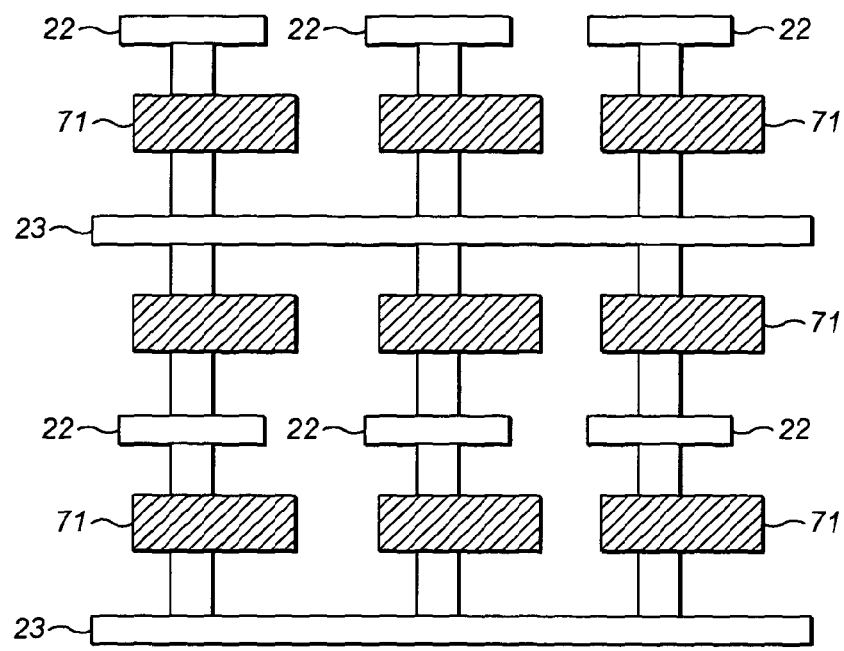
FIG. 12 illustrates steps in a method of manufacturing an electronic circuit embodying the invention, in which selected interconnections are formed between a plurality of transistors, each transistor embodying the invention, and having been formed by a method also embodying the invention.
Figure 12B:
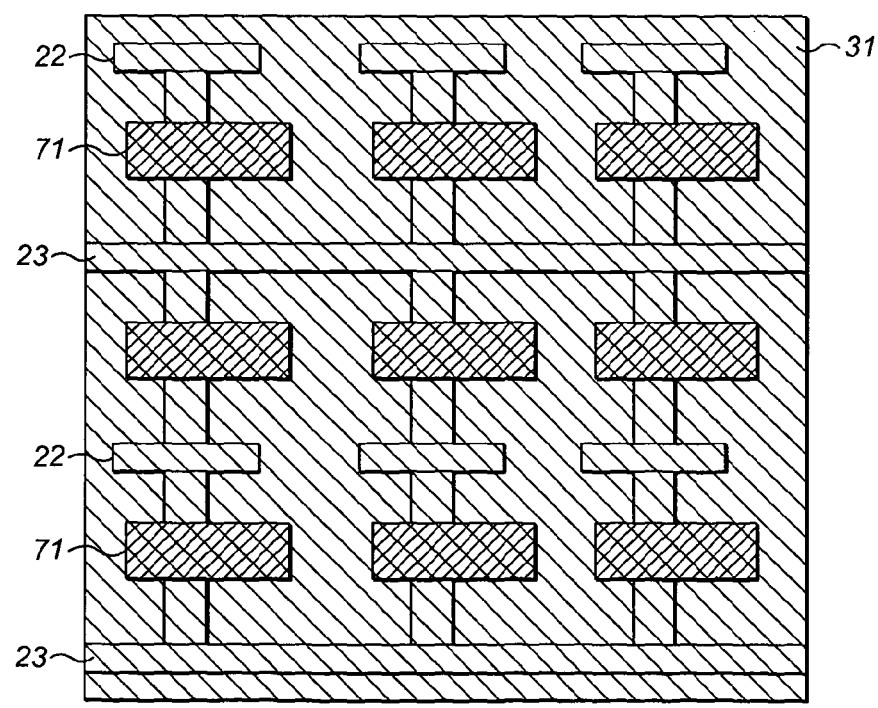
Figure 12C:
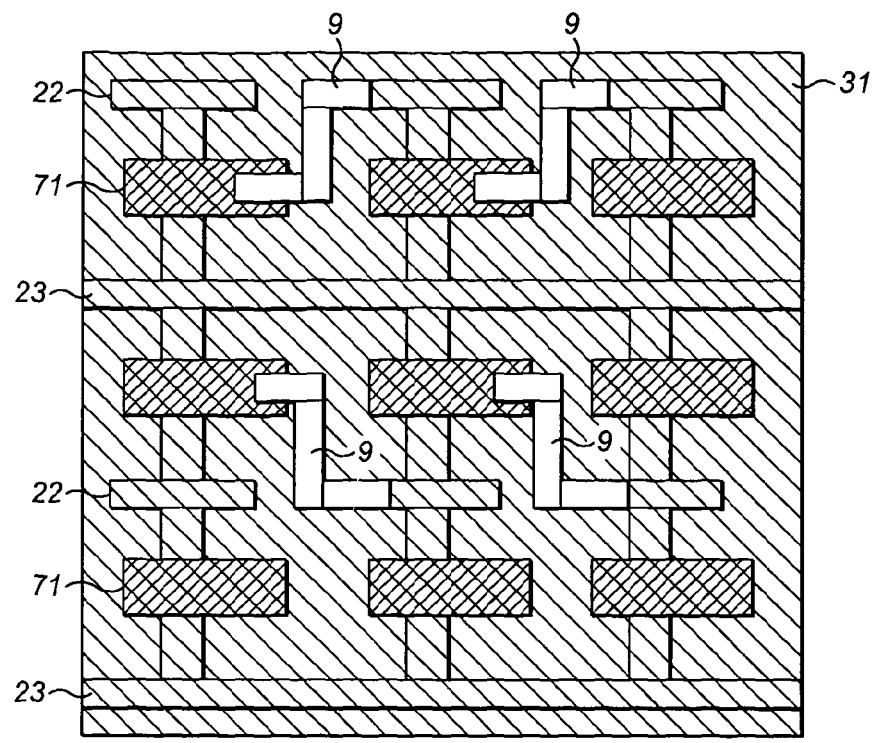
Figure 12D:
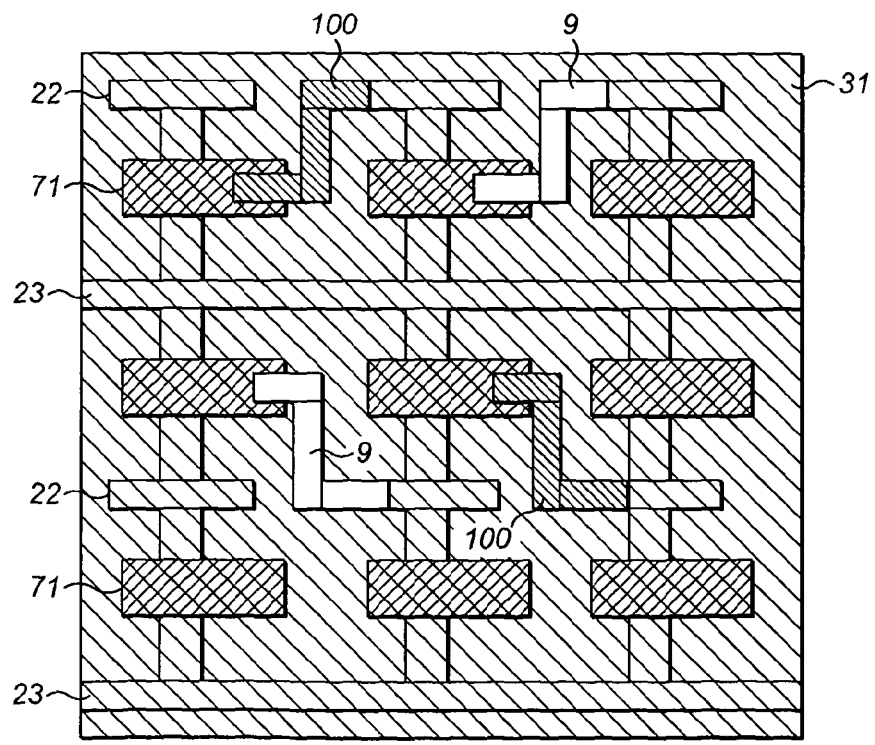
Figure 13A:
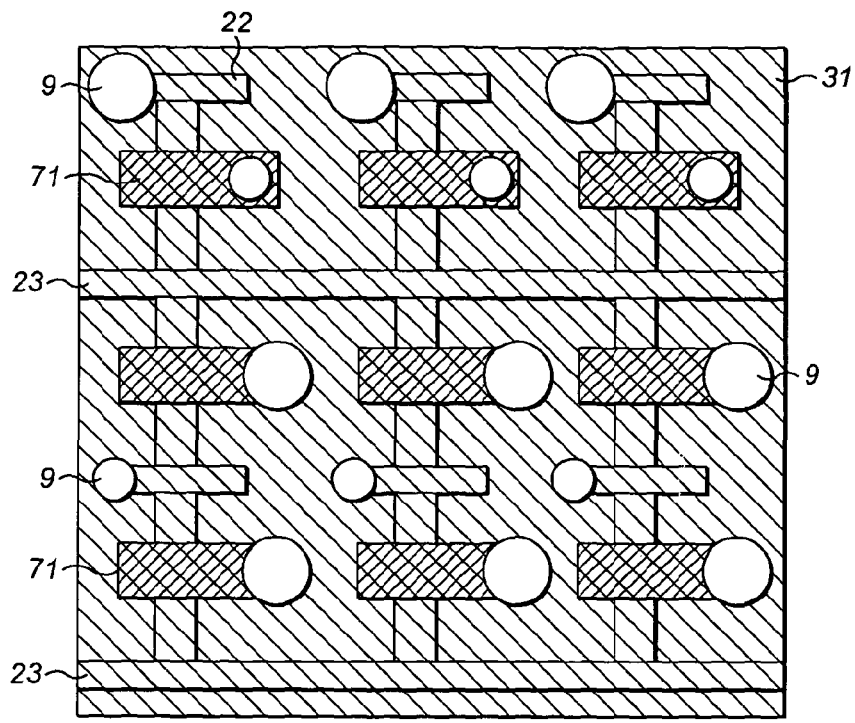
FIG. 13 illustrates steps in the manufacture of a thin-film transistor array in which all available programmable terminals are opened-up with via-holes, filled with conductive material, and a certain circuit is then selected by printing.
Figure 13B:
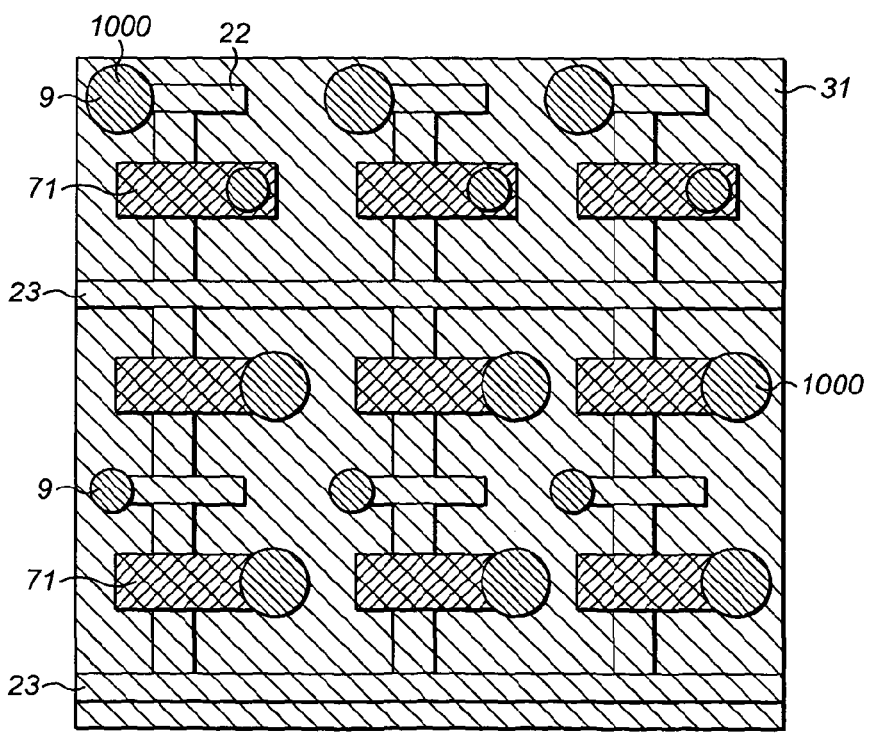
Figure 13C:
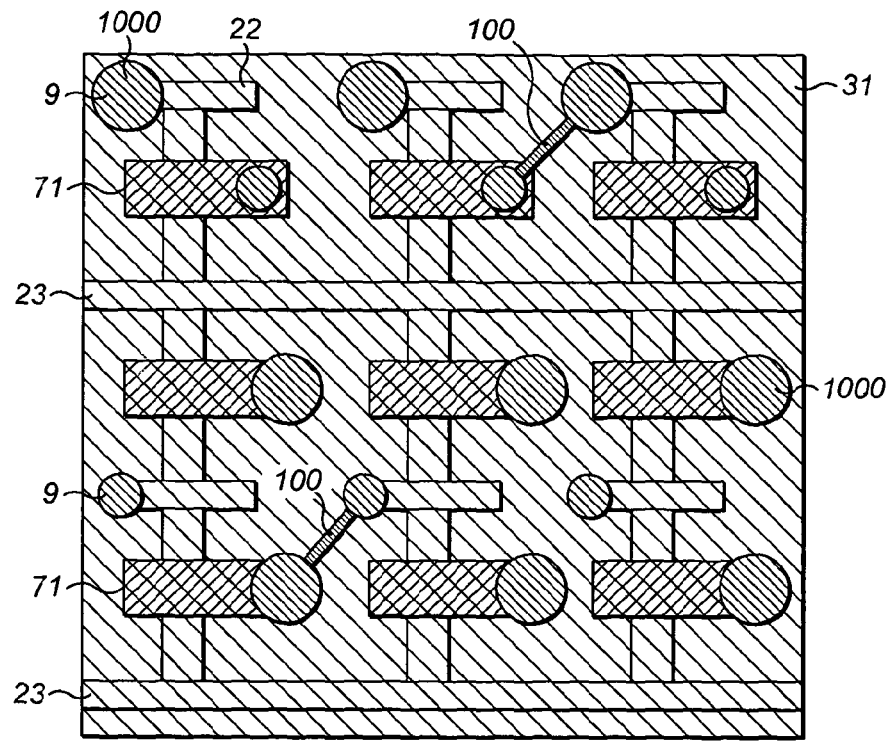
Figure 14A:
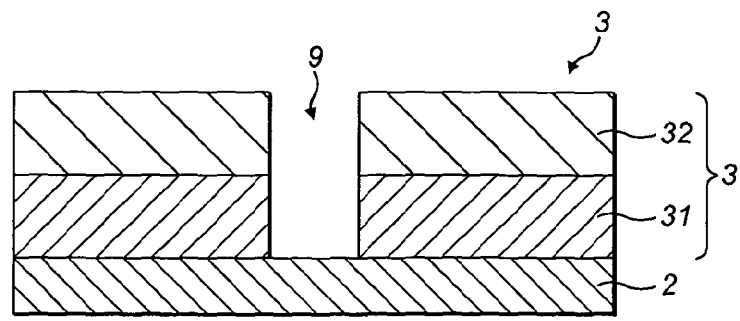
FIG. 14 illustrates a method for manufacturing a thin-film transistor embodying the invention in which the dielectric layer passivates the semiconductor layer.
Figure 14B:
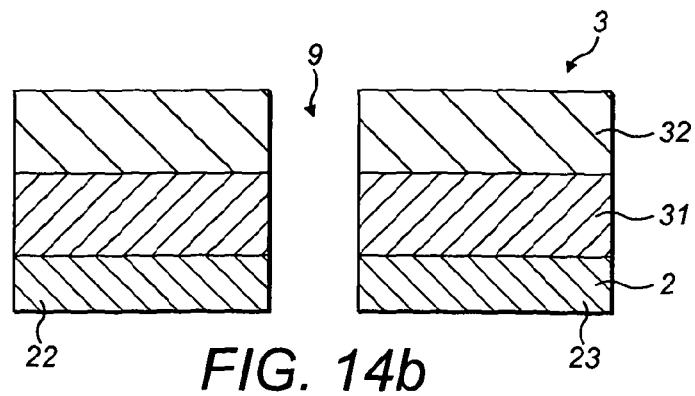
Figure 14C:
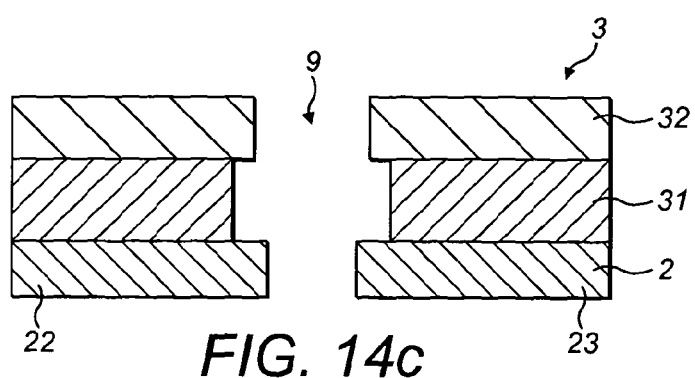
Figure 14D:
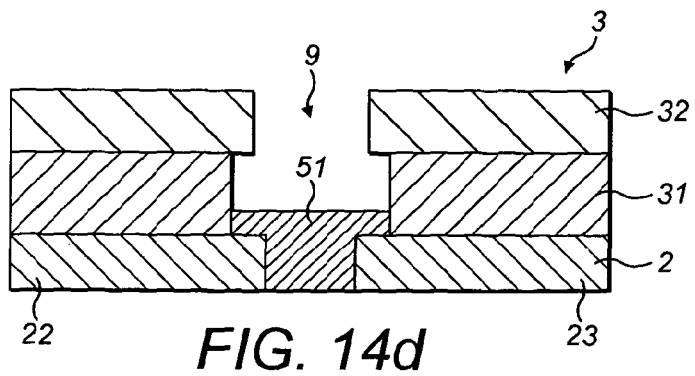
Figure 14E:
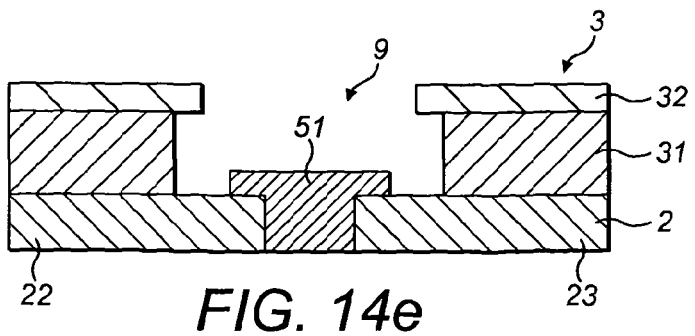
Figure 14F:
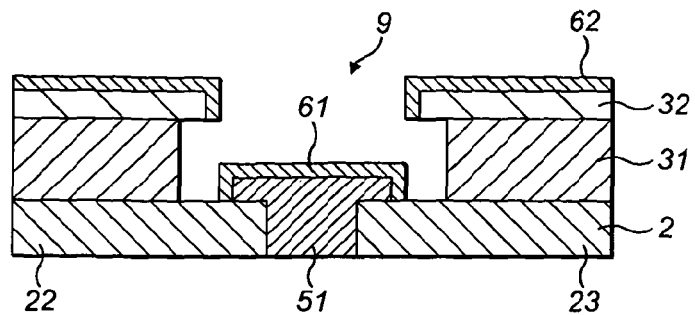
Figure 14G:
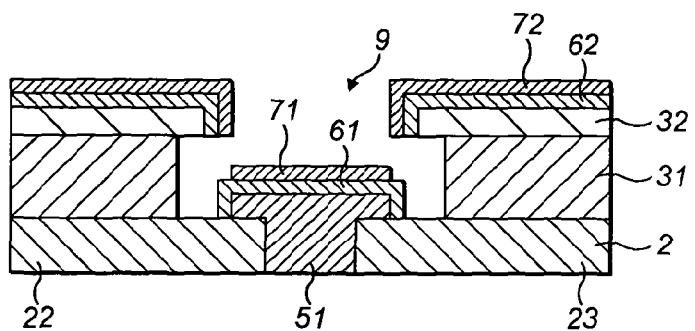
Figure 14H:
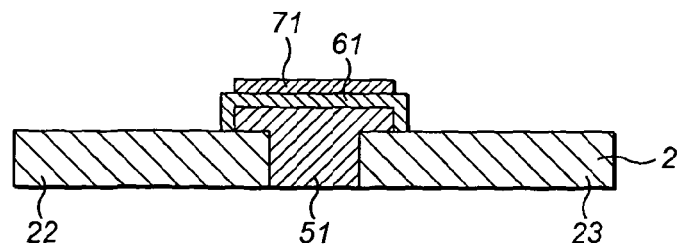
Figure 15A:
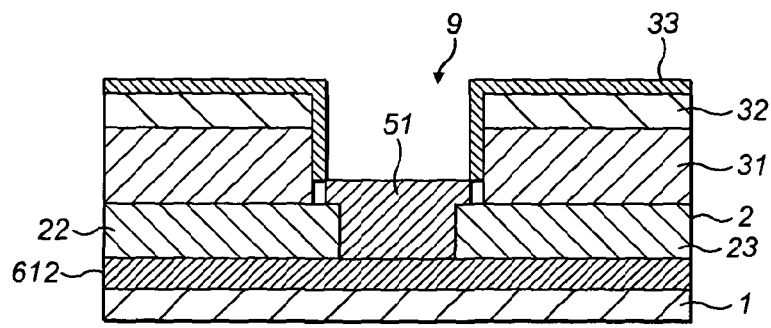
FIG. 15 illustrates a method for fabricating a thin-film transistor embodying the invention in which the dielectric layer passivates the semiconductor layer.
Figure 15B:
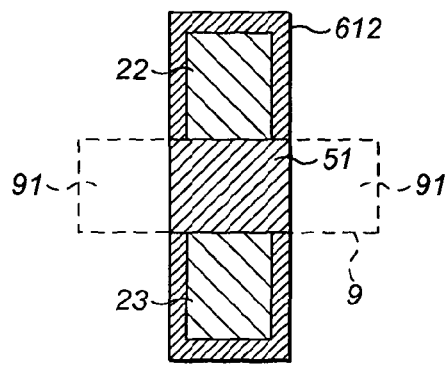
Figure 15C:
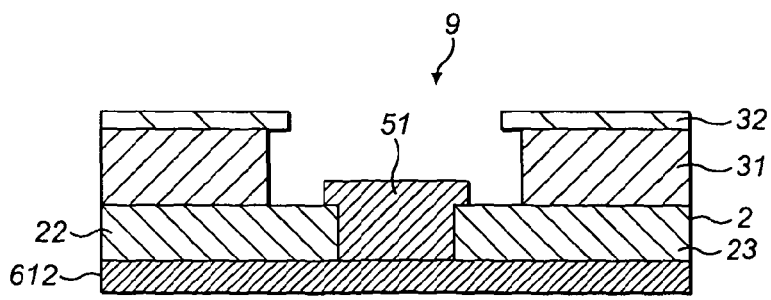
Figure 15D:
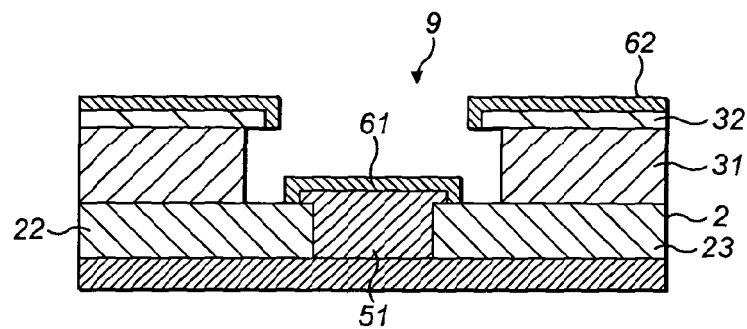
Figure 15E:
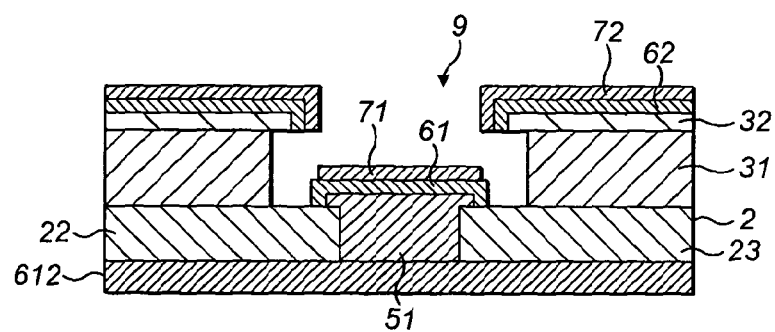
Figure 15F:
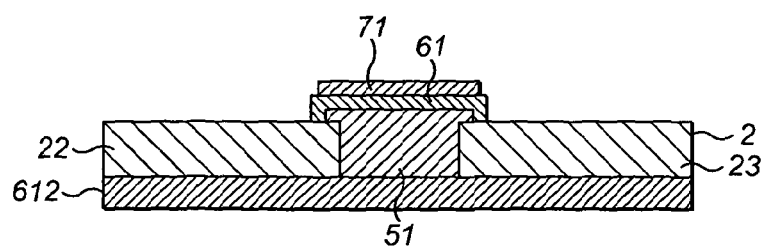
Figure 15G:
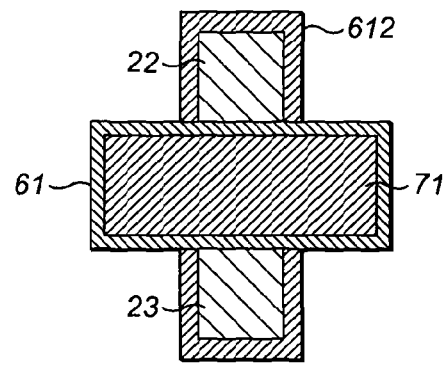

Referring now to FIG. 13, this shows the same regular array of thin-film transistors as in FIG. 12A which are being programmed. FIG. 13A has a layer of resist material 31 deposited onto the transistor array with via-holes 9 positioned over each terminal position in this case fabricated by laser-drilling. FIG. 13B shows a further step where the via-holes 9 have been filled with conductive material 1000 such as copper metal using chemical vapour deposition of Cupraselect™. FIG. 13C shows a final step where certain (i.e. selected) vias have been connected together with conductive material, e.g. by jet-printing of conductive ink, to form selected interconnects 100 and so program or select a particular circuit. It will be appreciated that an alternative to the step of filling-in each via-hole described in FIG. 13B is to use digital printing with conductive ink to in-fill and interconnect particular via-holes to select a desired functional circuit. The resist material 31 in this instance acts as a dielectric material for the interconnections.

Referring now to FIG. 14, this illustrates a method of forming a thin-film transistor in which the semiconductor layer is completely passivated by a dielectric layer. As shown in FIG. 14a the method provides a patterned layer of conductive material 2, which may or may not be supported on/by a substrate (not shown) on which a resist layer 3 has been formed, in this case consisting of a lower resist material 31, which is a lift-off resist, and an upper-layer 32 which is a UV imprint resist that has been cross-linked by UV irradiation. The conductive layer 2 is not continuous but for simplicity the side-view does not show the boundaries of the pattern which has been created. A depression has been formed in the resist material 3 and the residual layer removed such that there is a window 9 exposing the conductive material 2. FIG. 14b shows a subsequent step in which the conductive material, e.g., ITO, exposed in the window has been etched, such as $CH_4/H_2/Ar$ dry-etching of ITO, to create separated conductive areas 22 and 23, which respectively will form the source and drain terminals of a thin-film transistor. FIG. 14c shows a further step in which the resist material has been etched, e.g. $O_2$ plasma etching, to expose a small portion of the "upper" surfaces of conductive areas 22 and 23. In doing so, lower resist layer 31 has been laterally etched faster than upper resist 32 so as to create an undercut (alternatively a LOR developer could have been used to create an undercut). FIG. 14d shows a layer of semiconductor material 51, in this case zinc oxide, being deposited by atomic-layer deposition. The resist materials in layers 31 and 32 have been chemically formulated such that the deposition is unable to occur on the resist 3, i.e. it is repelled (additional surface treatments could have been used to achieve the same effect). The layer 51 thus forms on the exposed upper surface portions of conductive layers 22 and 23 and in the gap between them (the thickness would be substantially more uniform than is implied by the layer 51 which has been simplified for schematic purposes). FIG. 14e shows a further stage in which the resist 3 has been further etched by oxygen plasma to expose additional areas of conductive layers 22 and 23. In other words, the window 9 has been widened, after forming the semiconductive layer 51, but before forming the gate dielectric layer. FIG. 14f illustrates a subsequent step in which a dielectric material 61 has been deposited over the substrate. In this case a sputter deposition process is used to deposit the dielectric material, aluminium oxide, such that the dielectric 61 completely covers the semiconductor layer 51 but also resist 3. The dielectric material 62 deposited on resist 3 is interrupted by the undercut such that the film is not continuous. FIG. 14g shows a further step in which a conductive layer 71 has been deposited in this case by e-beam evaporation of titanium. The layer 72 covering dielectric 62 is interrupted by the undercut such that the layer 71 is not continuous over the whole substrate. FIG. 14h shows a final step in which the resist material 31 is removed by solvent removal, such as using NMP, lifting-off layers 32, 62 and 72 in the process. The remaining structure provides a thin-film transistor in which the semiconductor is passivated by a dielectric material.

Referring now to FIG. 15, this illustrates a method for producing a thin-film transistor embodying the invention with the semiconductor passivated with dielectric material. FIG. 15A provides a polymer substrate 1 on which a first dielectric layer 612 has been deposited, in this case aluminium oxide, with a layer of first conductive material 2, in this case ITO. The first conductive material is retained within a boundary defined by first dielectric layer 612. Layer 2 has been interrupted through a UV imprint and etch process which has opened-up window 9. The conductive material 2 within window 9 has been etched by $CH_4/H_2/Ar$ so as to define areas 22 and 23, respectively source and drain terminals of a thin-film transistor. The resist deposited for the UV imprint process consists of a lower imprint resist 31, in this case a lift-off resist, and an upper imprint resist 32, which is a UV curable imprint resin. Following the etch of layer 2 to define conductive regions 22 and 23, the resist layers 31 and 32 have been further etched so as to expose additional regions of layers 22 and 23. A further layer 33 has then been applied to the resist. This layer 33 is selective for the imprint resist 32 and lift-off resist 31 but cannot deposit onto the exposed layers 22, 23 or 612. One such material class is described in U.S. Pat. No. 7,034,129 and U.S. Pat. No. 6,699,527 which provides for a range of surface functionalities to be applied to plastic or polymeric substrates. In this case the coating applied will repel deposition of a zinc oxide semiconductive layer 51, deposited by atomic layer deposition. The semiconductive layer can form only over the exposed conductive areas 22 and 23 and the first dielectric layer 612, as shown in FIG. 15b. FIG. 15b also shows the window 9 which has been formed which extends beyond the area defined by layer 51. Layer 51 is unable to form on the additional areas 91 within window 9 due to the surface modification of the polymer substrate 1 in those areas. FIG. 15c shows a further step in which the additional resist layer 33 has been removed by $O_2$ plasma etching and resist layers 31 and 32 have been etched back, an undercut created in layer 31 using lift-off developer, to expose additional regions of conductive areas 22 and 23 and also first dielectric 612 (which is not shown on the side-view). FIG. 15d shows a further step when a second dielectric layer 61 has been deposited over the substrate, the layer being interrupted by the undercut such that there is isolated dielectric material 62 deposited onto the remaining upper resist layer 32. The second dielectric layer has been able to deposit over the entire exposed area within the widened window 9, including additional areas 91. FIG. 15e shows a further step where a conductive layer 71 has been deposited onto the substrate, with the undercut interrupting the layer 71 such that isolated conductive material 72 has been deposited onto layer 62. FIG. 15f shows a final step in which the lift-off resist 31 has been removed by exposure to lift-off removal solvent, removing also layers 32, 62 and 72. FIG. 15g shows a top-view of the final layout in which the layers 61 and 71 extend beyond the region between layers 22 and 23, but the semiconductive channel 51 (not shown) is confined to the regions directly between 22 and 23.

Figure 16A:
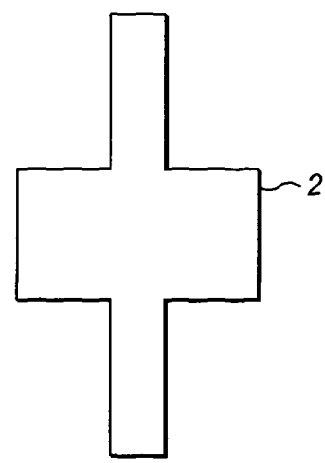
FIG. 16 illustrates a method for fabricating a thin-film transistor embodying the invention in which the source and drain regions are interdigitated.
Figure 16B:
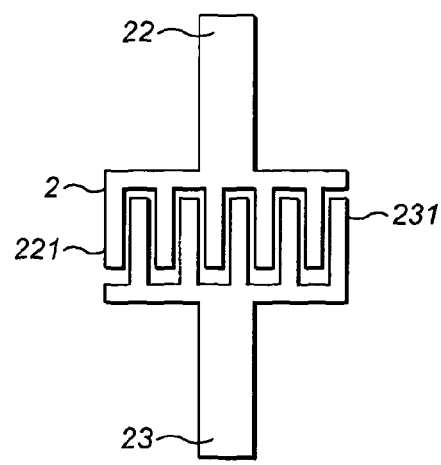
Figure 16C:
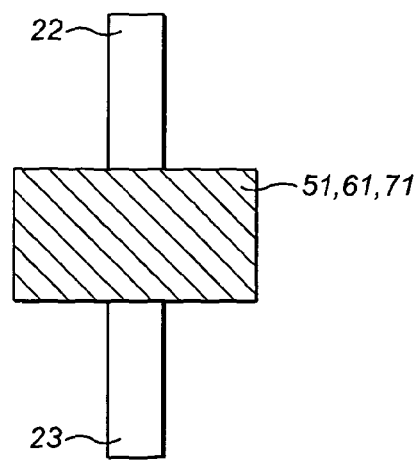

Referring now to FIG. 16, this shows a method for creating a thin-film transistor with interdigitated source and drain terminals. FIG. 16a shows a further conductive layer 2 which has been deposited onto a substrate (not shown). FIG. 16b shows a further step in which a window (having a meandering shape) has been opened over conductive area 2 and exposed regions of layer 2 have been etched. In this case a UV imprint tool has been aligned to layer 2 and used to pattern a layer of UV imprint resist which has an underlayer of lift-off resist beneath. The residual layers remaining after the UV imprint have been removed by oxygen plasma etching. The design on the tool is such that the conductive layer 2 has been patterned into parallel but disconnected regions or "interdigitated fingers" 221 and 231, which are respectively connected to source region 22 and drain region 23. FIG. 16c shows a further step in which the resist materials have been further etched laterally so as to expose the entire regions 221 and 231 and further areas of regions 22 and 23. A semiconductor layer 51, dielectric layer 61 and second conductive layer 71 have then been deposited sequentially so as to define a thin-film transistor structure between source terminal 22 and drain terminal 23.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

It will be also be appreciated that, throughout the description and claims of this specification, language in the general form of "X for Y" (where Y is some action, activity or step and X is some means for carrying out that action, activity or step) encompasses means X adapted or arranged specifically, but not exclusively, to do Y.

The invention claimed is:

1. A method of manufacturing a transistor, the method comprising:
   providing a substrate and a region of electrically conductive material supported by the substrate;
   forming at least one layer of resist material over said region to form a covering of resist material over said region;
   forming a depression in a surface of the covering of resist material, said depression extending over a first portion of said region, said first portion separating a second portion of the region from a third portion of the region;
   removing resist material located under said depression so as to form a window, through said covering, exposing said first portion of the electrically conductive region;
   removing said first portion to expose a portion of substrate separating the second portion from the third portion of the region;
   depositing semiconductive material at least inside the window to form a layer of semiconductive material connecting the second portion to the third portion;
   depositing dielectric material to form a layer of dielectric material over said layer of semiconductive material;
   depositing electrically conductive material to form a layer of electrically conductive material over said layer of dielectric material;
   removing resist material at least from around said window so as to expose the second and third portions,
   wherein said second and third portions provide a source terminal and a drain terminal respectively and the layer of electrically conductive material provides a gate terminal to which a potential may be applied to control a conductivity of the layer of semiconductive material connecting the second and third portions;
   undercutting the covering of resist material around the window before said depositing of semiconductive material so as to expose a part of an upper surface of the second portion adjacent the separating portion of substrate and expose a part of an upper surface of the third portion adjacent the separating portion of substrate; and
   forming a step in said exposed part of the second portion and a step in said exposed part of the third portion before depositing said semiconductive material.

2. A method in accordance with claim 1, wherein said depositing of semiconductive material is arranged such that the layer of semiconductive material covers at least part of each said step.

3. A method of forming an electrical circuit comprising a plurality of transistors, the method comprising: forming each said transistor on a common substrate using a method in accordance with claim 1; and forming interconnections between said transistors.

4. A method of forming an electronic circuit, the method comprising manufacturing an array of a plurality of transistors on a common substrate using a method in accordance with claim 1, forming a covering of dielectric material over the array of transistors, forming a plurality of windows in the covering of dielectric material, each window exposing at least a portion of a terminal of a respective transistor, and selectively forming interconnections between said exposed portions of terminals.

5. A method in accordance with claim 4, wherein said selectively forming interconnections comprises printing conductive material.

6. A method of manufacturing a transistor, the method comprising:
   providing a substrate and a region of electrically conductive material supported by the substrate;
   forming at least one layer of resist material over said region to form a covering of resist material over said region;
   forming a depression in a surface of the covering of resist material, said depression extending over a first portion of said region, said first portion separating a second portion of the region from a third portion of the region;
   removing resist material located under said depression so as to form a window, through said covering, exposing said first portion of the electrically conductive region;
   removing said first portion to expose a portion of substrate separating the second portion from the third portion of the region;
   depositing semiconductive material at least inside the window to form a layer of semiconductive material connecting the second portion to the third portion;
   depositing dielectric material to form a layer of dielectric material over said layer of semiconductive material;
   depositing electrically conductive material to form a layer of electrically conductive material over said layer of dielectric material;
   removing resist material at least from around said window so as to expose the second and third portions,
   wherein said second and third portions provide a source terminal and a drain terminal respectively and the layer of electrically conductive material provides a gate terminal to which a potential may be applied to control a conductivity of the layer of semiconductive material connecting the second and third portions;
   undercutting the covering of resist material around the window before said depositing of semiconductive material so as to expose a part of an upper surface of the second portion adjacent the separating portion of substrate and expose a part of an upper surface of the third portion adjacent the separating portion of substrate; and removing resist material to widen said window after said undercutting but before said depositing of semiconductive material.

7. A method of manufacturing a transistor, the method comprising:

providing a substrate and a region of electrically conductive material supported by the substrate;

forming at least one layer of resist material over said region to form a covering of resist material over said region;

forming a depression in a surface of the covering of resist material, said depression extending over a first portion of said region said first portion separating a second portion of the region from a third portion of the region;

removing resist material located under said depression so as to form a window, through said covering, exposing said first portion of the electrically conductive region;

removing said first portion to expose a portion of substrate separating the second portion from the third portion of the region;

depositing semiconductive material at least inside the window to form a layer of semiconductive material connecting the second portion to the third portion;

depositing dielectric material to form a layer of dielectric material over said layer of semiconductive material;

depositing electrically conductive material to form a layer of electrically conductive material over said layer of dielectric material;

removing resist material at least from around said window so as to expose the second and third portions, wherein said second and third portions provide a source terminal and a drain terminal respectively and the layer of electrically conductive material provides a gate terminal to which a potential may be applied to control a conductivity of the layer of semiconductive material connecting the second and third portions;

undercutting the covering of resist material around the window before said depositing of semiconductive material so as to expose a part of an upper surface of the second portion adjacent the separating portion of substrate and expose a part of an upper surface of the third portion adjacent the separating portion of substrate; and removing resist material to widen said window at the same time as said undercutting.

8. A method of manufacturing a transistor, the method comprising:

providing a substrate supporting a source terminal and a drain terminal, with a separating portion of the substrate being arranged below the source and drain terminals and extending between the source and drain terminals;

forming at least one layer of resist material over the source terminal, the drain terminal and said separating portion of the substrate to form a covering of resist material over the source terminal, the drain terminal and said separating portion of the substrate;

forming a depression in a surface of the covering of resist material, said depression extending over the separating portion of the substrate and over at least respective portions of the source and drain terminals adjacent the separating portion;

removing resist material located under said depression so as to form a window, through said covering, exposing the separating portion of substrate and said respective portions of the source and drain terminals adjacent the separating portion;

depositing semiconductive material at least inside said window to form a layer of semiconductive material connecting the source terminal to the drain terminal;

depositing dielectric material to form a layer of dielectric material over said layer of semiconductive material;

depositing electrically conductive material to form a layer of electrically conductive material over said layer of dielectric material; and removing resist material at least from around said window so as to expose at least part of the source terminal and at least part of the drain terminal, wherein said layer of electrically conductive material provides a gate terminal to which a potential may be applied to control a conductivity of the layer of semiconductive material connecting the source and drain terminals.

9. A method in accordance with claim 8, wherein said forming at least one layer comprises forming a first layer of a first resist material over the source terminal, the drain terminal and said separating portion of the substrate, and forming a second layer of a second resist material over the first layer.

10. A method in accordance with claim 8, further comprising undercutting the covering of resist material around the window before said depositing of semiconductive material so as to expose additional portions of the source and drain terminals adjacent said respective portions.

11. A method in accordance with claim 10, wherein said depositing of semiconductive material is arranged such that the layer of semiconductive material at least partly covers said additional portions.

12. A method in accordance with claim 8, further comprising forming a step in an exposed portion of the source terminal and a step in an exposed portion of the drain terminal before depositing said semiconductive material.

13. A method in accordance with claim 12, wherein said depositing of semiconductive material is arranged such that the layer of semiconductive material covers at least part of each said step.

14. A method of manufacturing a transistor, the method comprising:

providing a substrate and a region of electrically conductive material supported by the substrate;

forming at least one layer of resist material over said region to form a covering of resist material over said region;

forming a depression in a surface of the covering of resist material, said depression extending over a first portion of said re ion said first portion separating a second portion of the region from a third portion of the region;

removing resist material located under said depression so as to form a window, through said covering, exposing said first portion of the electrically conductive region;

removing said first portion to expose a portion of substrate separating the second portion from the third portion of the region;

depositing semiconductive material at least inside the window to form a layer of semiconductive material connecting the second portion to the third portion;

depositing dielectric material to form a layer of dielectric material over said layer of semiconductive material;

depositing electrically conductive material to form a layer of electrically conductive material over said layer of dielectric material;

removing resist material at least from around said window so as to expose the second and third portions, wherein said second and third portions provide a source terminal and a drain terminal respectively and the layer of electrically conductive material provides a gate terminal to which a potential may be applied to control a conductivity of the layer of semiconductive material connecting the second and third portions;

forming an undercut in the layer of semiconductive material extending underneath the gate terminal from an edge of the gate terminal, and forming an electrical track extending from the gate terminal and over said edge, wherein the undercut in the layer of semiconductive material prevents electrical contact between the electrical track and the layer of semiconductive material.

15. A method of manufacturing a transistor, the method comprising:

providing a substrate and a region of electrically conductive material supported by the substrate;

forming at least one layer of resist material over said region to form a covering of resist material over said region;

forming a depression in a surface of the covering of resist material, said depression extending over a first portion of said region, said first portion separating a second portion of the region from a third portion of the region;

removing resist material located under said depression so as to form a window, through said covering, exposing said first portion of the electrically conductive region;

removing said first portion to expose a portion of substrate separating the second portion from the third portion of the region;

depositing semiconductive material at least inside the window to form a layer of semiconductive material connecting the second portion to the third portion;

depositing dielectric material to form a layer of dielectric material over said layer of semiconductive material;

depositing electrically conductive material to form a layer of electrically conductive material over said layer of dielectric material;

removing resist material at least from around said window so as to expose the second and third portions, wherein said second and third portions provide a source terminal and a drain terminal respectively and the layer of electrically conductive material provides a gate terminal to which a potential may be applied to control a conductivity of the layer of semiconductive material connecting the second and third portions;

widening said window after said depositing of semiconductive material but before said depositing of dielectric material.

16. A method in accordance with claim 15, wherein widening said window further comprises forming an undercut or deepening an undercut in the covering of resist material.

* * * * *

UNITED STATES PATENT AND TRADEMARK OFFICE
CERTIFICATE OF CORRECTION

PATENT NO. : 9,263,553 B2
APPLICATION NO. : 13/638061
DATED : February 16, 2016
INVENTOR(S) : Richard David Price It is certified that error appears in the above-identified patent and that said Letters Patent is hereby corrected as shown below:

In the Claims:
Column 25, Claim 7, Line 16: Please correct "said region said first"
                                      to read -- said region, said first --

Column 26, Claim 14, Line 50: Please correct "said re ion"
                                        to read -- said region, --

Signed and Sealed this
Twenty-third Day of August, 2016

Michelle K. Lee
*Director of the United States Patent and Trademark Office*